(12) United States Patent
Sukekawa

(10) Patent No.: US 11,031,374 B2
(45) Date of Patent: Jun. 8, 2021

(54) METHODS OF COMPENSATING FOR MISALIGNMENT OF BONDED SEMICONDUCTOR WAFERS

(71) Applicant: Micron Technology, Inc., Boise, ID (US)

(72) Inventor: Mitsunari Sukekawa, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 16/294,782

(22) Filed: Mar. 6, 2019

(65) Prior Publication Data

US 2020/0286859 A1    Sep. 10, 2020

(51) Int. Cl.
*H01L 25/065*   (2006.01)
*H01L 25/18*    (2006.01)
*H01L 25/00*    (2006.01)

(52) U.S. Cl.
CPC .......... *H01L 25/0657* (2013.01); *H01L 25/18* (2013.01); *H01L 25/50* (2013.01); *H01L 2225/06527* (2013.01); *H01L 2225/06593* (2013.01)

(58) Field of Classification Search
CPC ......... H01L 2224/0239; H01L 2224/80; H01L 2224/0231; H01L 2224/08; H01L 2224/024; H01L 2224/9222; H01L 2224/03; H01L 2224/11; H01L 2224/13; H01L 24/03; H01L 24/05; H01L 2224/08146; H01L 2224/32145; H01L 2224/80907; H01L 25/0657; H01L 25/50; H01L 25/18; H01L 2225/06593; H01L 2225/06527; H01L 24/09; H01L 24/94; H01L 2224/94; H01L 24/80; H01L 27/10; H01L 21/8221; H01L 2225/06513; H01L 2224/08145; H01L 2224/8012; H01L 2224/80121; H01L 2224/80986; G11C 5/06; G11C 7/18; G11C 8/14
USPC ....................................................... 438/107
See application file for complete search history.

(56) References Cited

U.S. PATENT DOCUMENTS

| | | | |
|---|---|---|---|
| 7,943,428 B2 * | 5/2011 | Gambino | H01L 23/481 438/118 |
| 9,087,821 B2 * | 7/2015 | Lin | H01L 24/89 |
| 9,666,573 B1 | 5/2017 | Sukekawa | |
| 10,103,053 B1 | 10/2018 | Sukekawa | |
| 2008/0054489 A1 * | 3/2008 | Farrar | H01L 25/50 257/777 |

(Continued)

*Primary Examiner* — Duy T Nguyen
(74) *Attorney, Agent, or Firm* — Wells St. John P.S.

(57) ABSTRACT

Some embodiments include a method in which a first semiconductor wafer and a second semiconductor wafer are bonded with each other. The first semiconductor wafer includes a memory cell array, and the second semiconductor wafer includes a circuit to access the memory cell array. After the bonding, contacts are formed to be associated with the first semiconductor wafer. The contacts are for electrical connections between the first and second semiconductor wafers. The contacts are linked with reference positions, with each of the contacts being linked with an associated one of the reference positions. Each of the contacts is shifted from its associated one of the reference positions to absorb a bonding alignment error between the first and second semiconductor wafers.

38 Claims, 21 Drawing Sheets

(56) References Cited

U.S. PATENT DOCUMENTS

2013/0207271 A1* 8/2013 Hagimoto ............ A43B 13/185
  257/770
2015/0108644 A1* 4/2015 Kuang ................ H01L 23/5385
  257/751

* cited by examiner

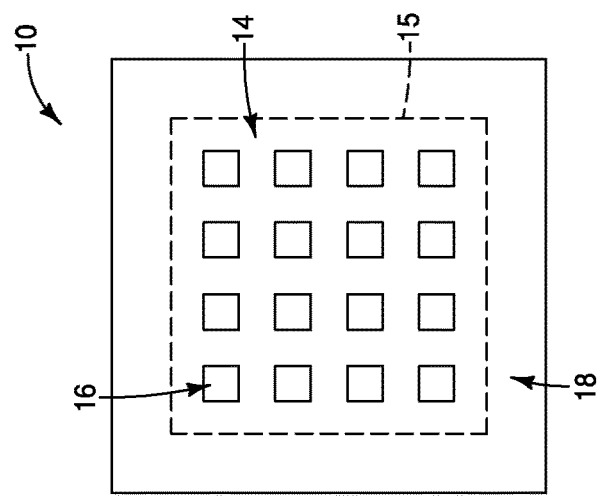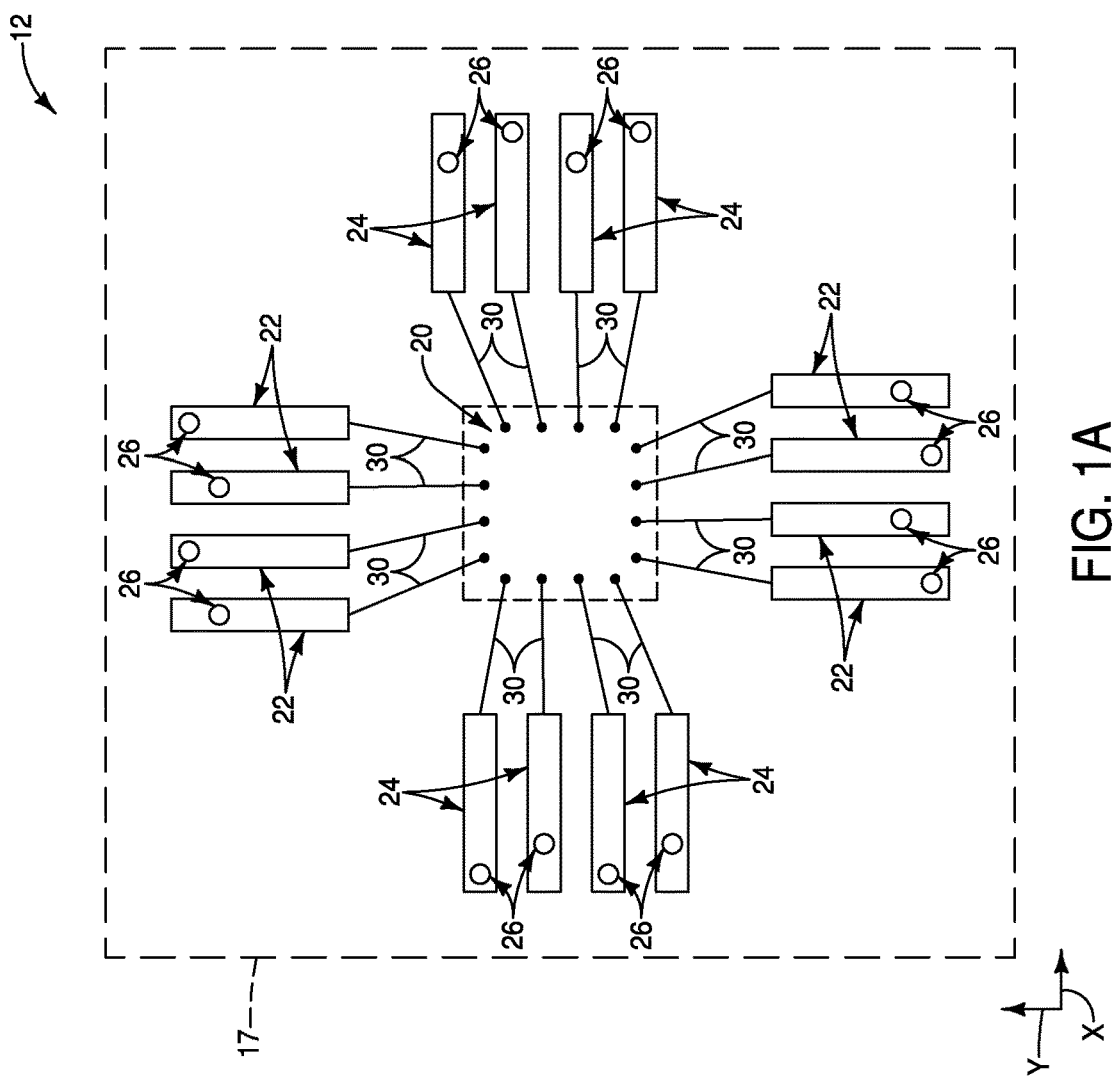

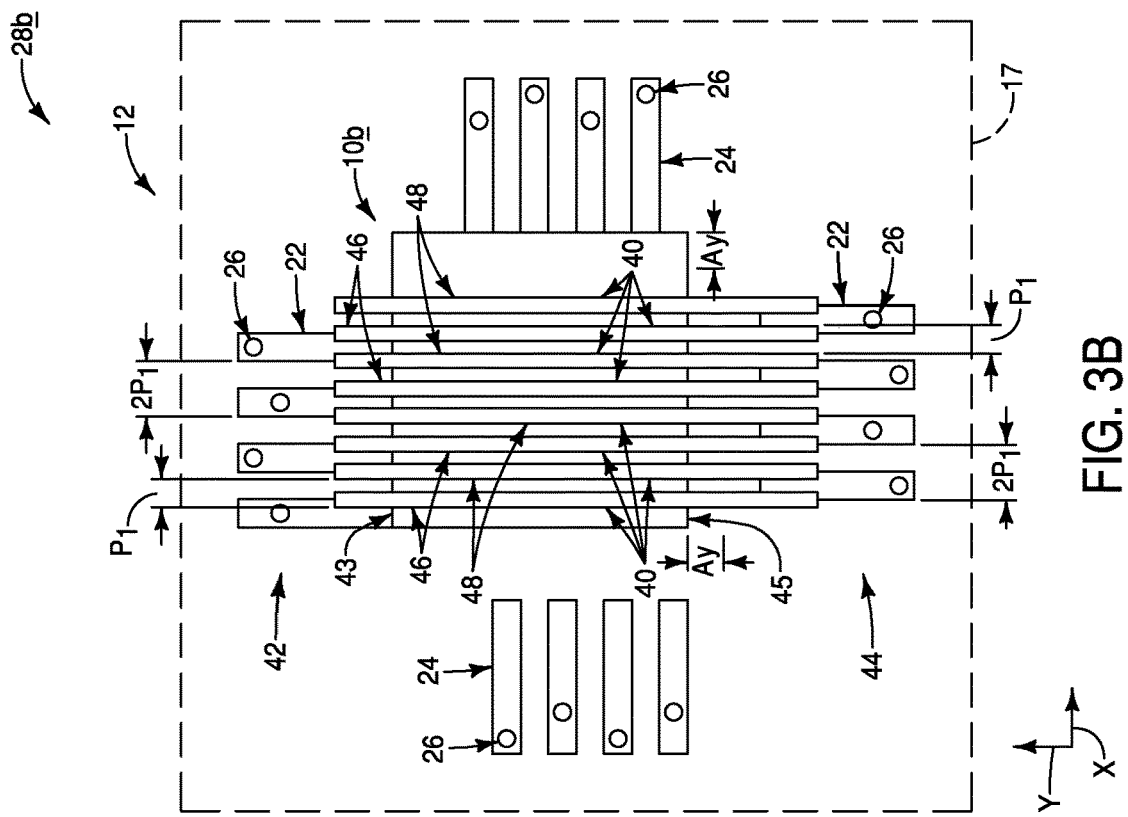
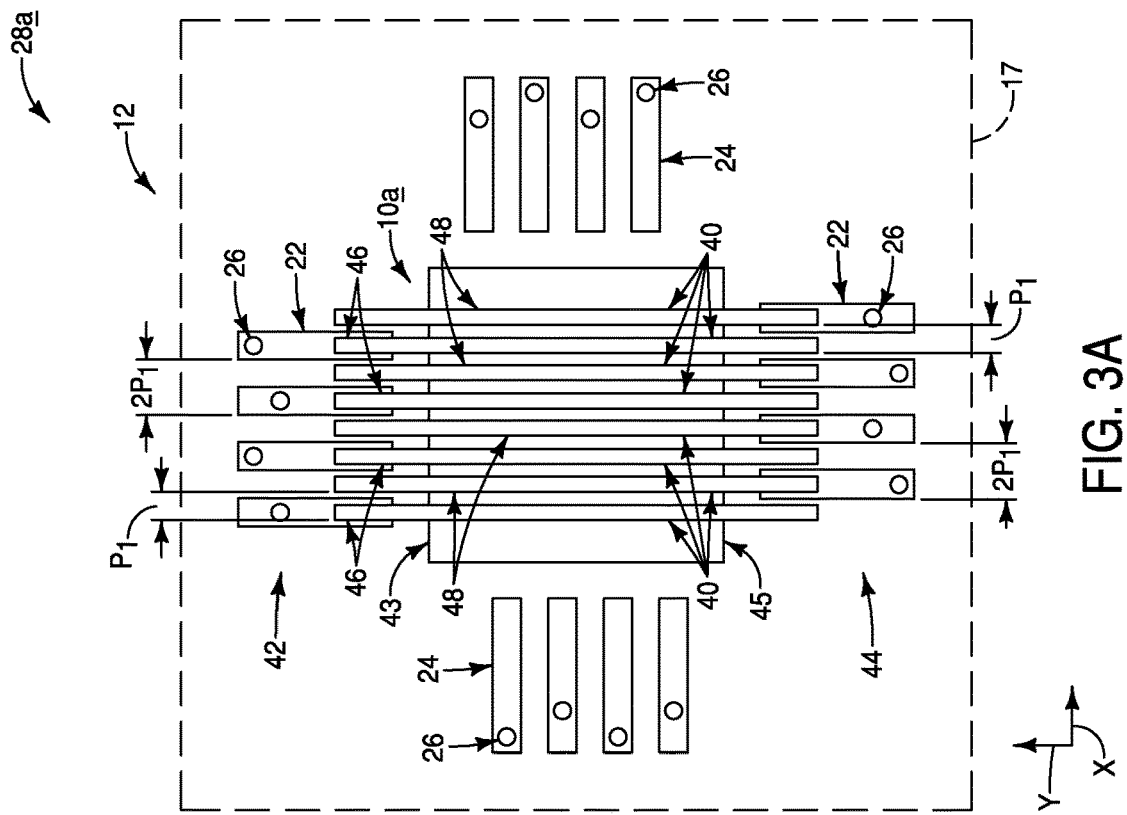

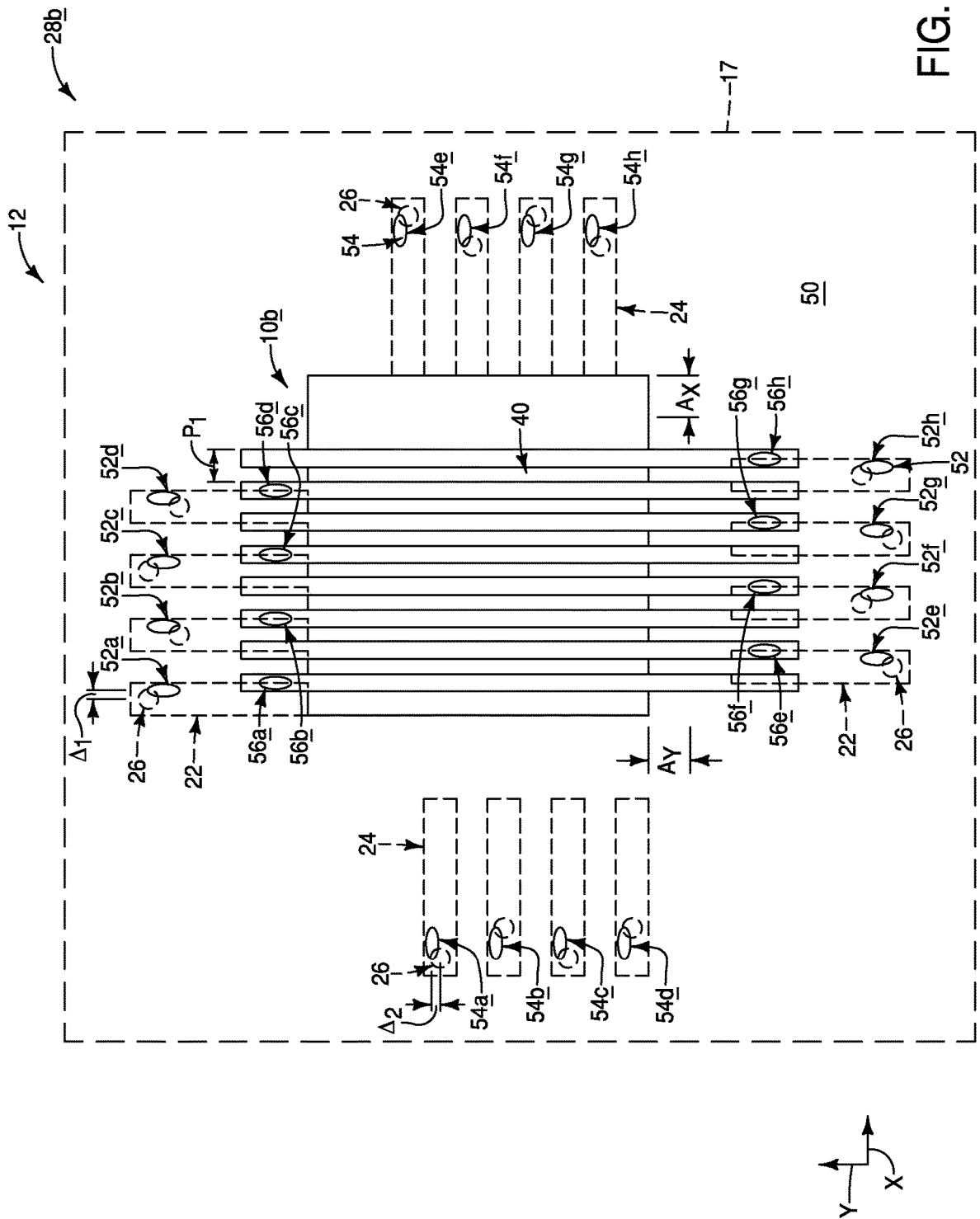

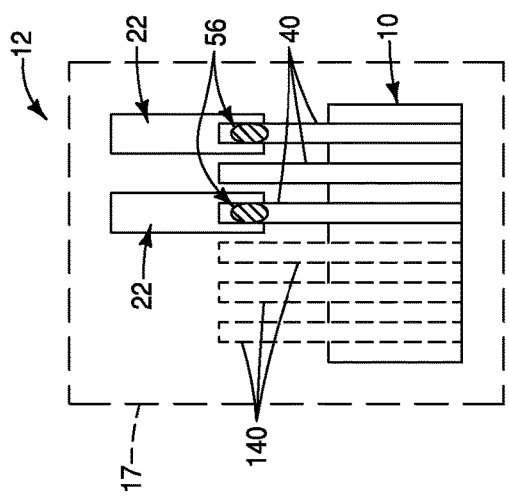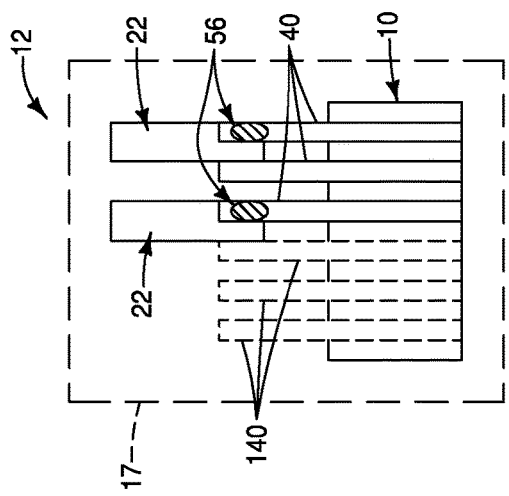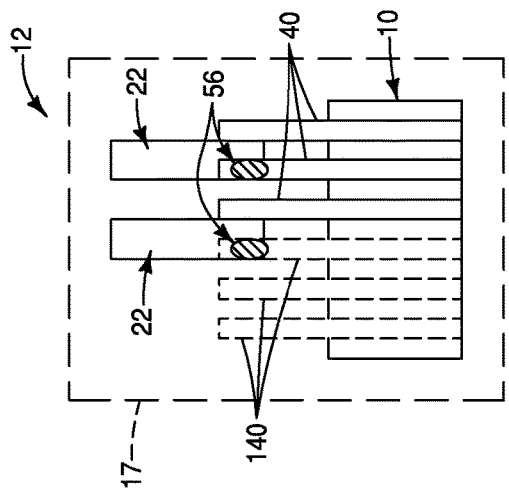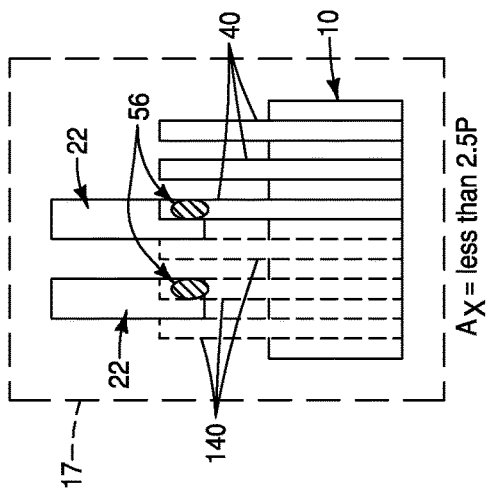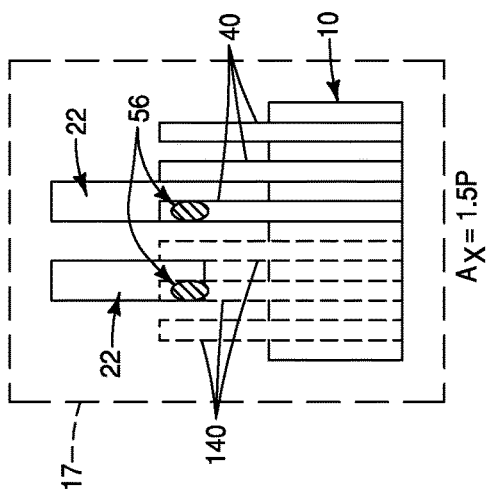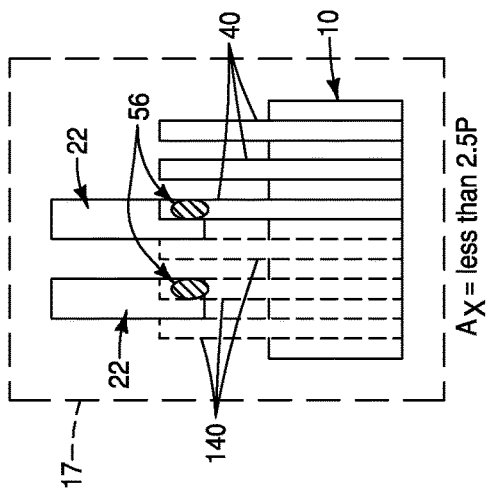

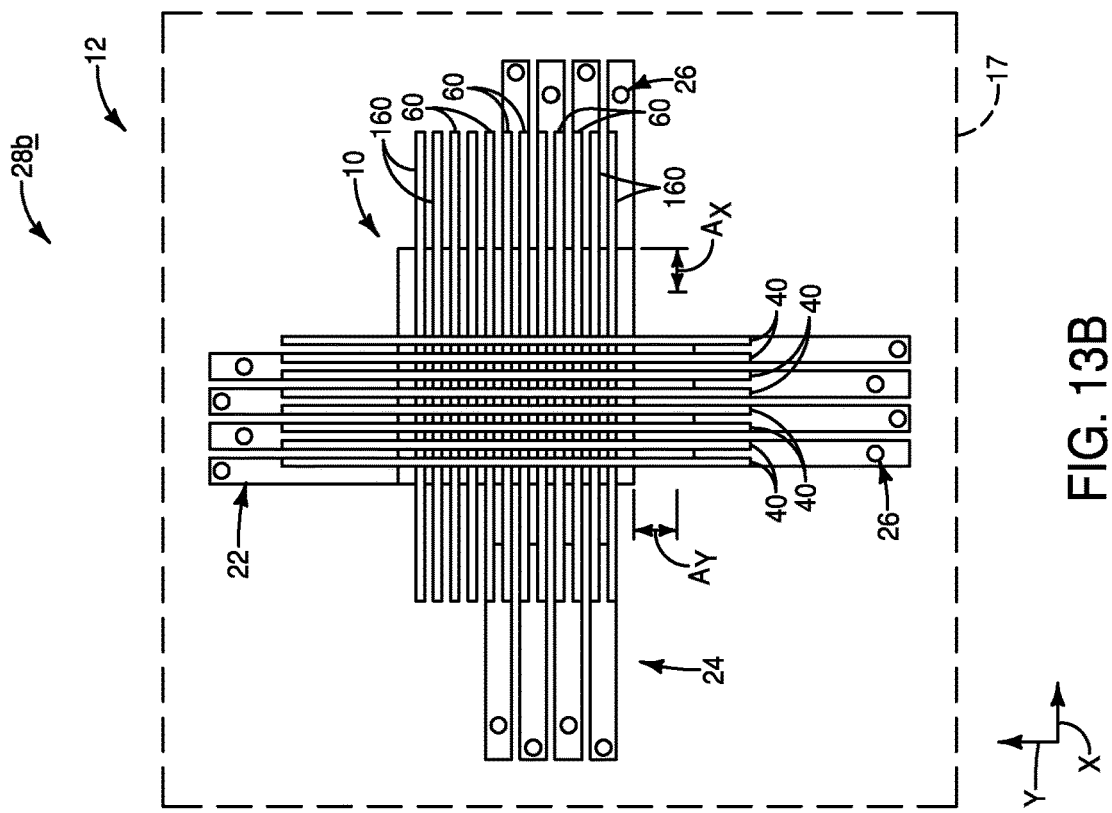
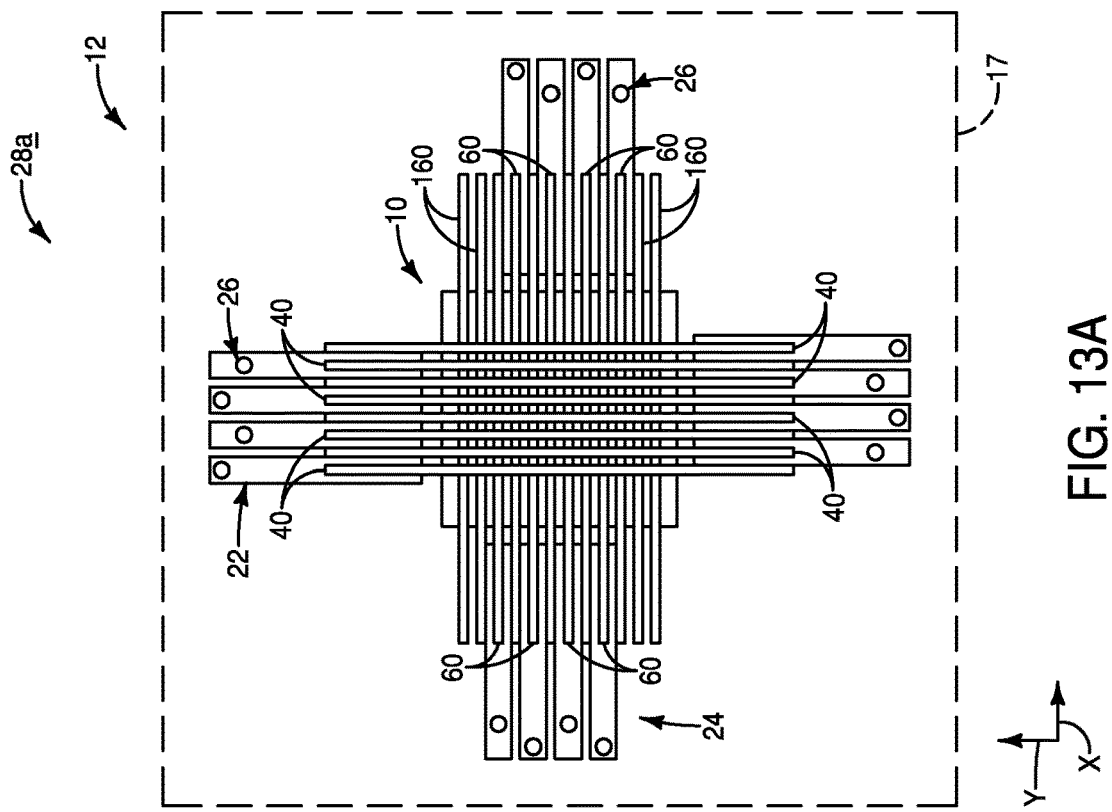

METHODS OF COMPENSATING FOR MISALIGNMENT OF BONDED SEMICONDUCTOR WAFERS

TECHNICAL FIELD

Methods of compensating for misalignment of bonded semiconductor wafers.

BACKGROUND

Three-dimensional integrated assemblies may be constructed by bonding two or more wafers with one another utilizing "wafer-bonding" technology. Example wafer-bonding procedures are described in U.S. Pat. Nos. 9,666,573 and 10,103,053, both of which are assigned to Micron Technology, Inc., and both of which list Mitsunari Sukekawa as an inventor.

Problems may be encountered during the bonding of the wafers which may lead to misalignment of the wafers relative to one another. Substantial effort has been directed toward compensating for potential alignment errors occurring during lithographic (e.g., photolithographic) processes. However, the alignment errors incurred during wafer-bonding may be significantly larger than the alignment errors incurred during lithographic processes. Accordingly, it is desirable to develop methodologies tailored for compensating for the relatively large misalignments which may occur during wafer-bonding.

A potential application for wafer-bonding technology pertains to the fabrication of memory. In some applications, one of the bonded wafers may comprise a memory array having conventional memory circuitry (e.g., wordlines, bitlines, etc.), and another of the bonded wafers may comprise conventional peripheral circuitry (i.e., circuitry utilized in conjunction with the memory array, but typically provided peripheral to the memory array; such as, for example, wordline-driver circuitry, sense-amplifier circuitry, input circuitry, output circuitry, etc.). The problematic misalignment encountered during wafer-bonding technology may render it difficult to couple the memory circuitry along one of the bonded wafers with the peripheral circuitry along another of the bonded wafers. It would be desirable to develop methodologies suitable for enabling coupling of the memory circuitry from a first wafer with the peripheral circuitry provided by a second wafer bonded to the first wafer.

BRIEF DESCRIPTION OF THE DRAWINGS

FIGS. 1A and 1B are diagrammatic top views of regions of first and second semiconductor wafers, respectively.

FIG. 2A shows the wafers aligned relative to one another, and FIG. 2B shows the wafers misaligned.

FIGS. 3A and 3B are top views of an assembly having bonded wafers. FIG. 3A shows the assembly in a configuration in which the wafers are aligned relative to one another, and FIG. 3B shows the assembly in a configuration in which the wafers are misaligned.

FIGS. 4A and 4B are top views of the assemblies of FIGS. 3A and 3B, respectively, at a process stage subsequent to that of FIGS. 3A and 3B.

FIGS. 6A-6F are top views of an assembly having bonded wafers, and illustrate varying degrees of x-axis misalignment between the wafers.

FIG. 8A shows an assembly in a configuration in which the wafers are aligned relative to one another, and FIG. 8B shows an assembly in a configuration in which the wafers are misaligned.

FIG. 12A shows an assembly in a configuration in which the wafers are aligned relative to one another, and FIG. 12B shows an assembly in a configuration in which the wafers are misaligned.

FIGS. 13A and 13B are top views of the assemblies of FIGS. 12A and 12B, respectively, at a process stage subsequent to that of FIGS. 12A and 12B.

DETAILED DESCRIPTION OF THE ILLUSTRATED EMBODIMENTS

Figure 1D:
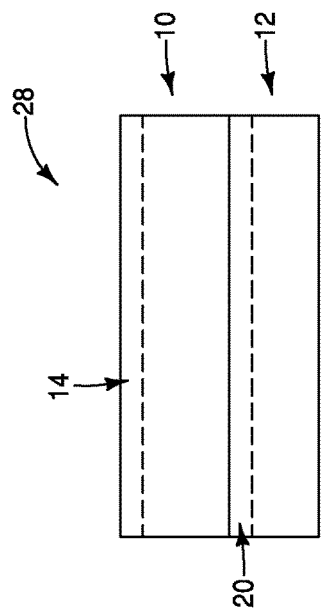
FIGS. 1C and 1D are a diagrammatic top view and diagrammatic cross-sectional side view of an assembly comprising the first and second wafers of FIGS. 1A and 1B bonded to one another. The view of FIG. 1D is along the line D-D of FIG. 1C.

Some embodiments include methods in which two or more wafers are bonded with one another, and in which contacts along at least one of the wafers are shifted to compensate for misalignment of the wafers and to thereby enable coupling with circuitry along another of the wafers. Some embodiments include utilization of redundant components (for instance, redundant wordlines and/or redundant bitlines) of a memory array along a first wafer to compensate for misalignment of the first wafer relative to a second wafer bonded to the first wafer. An equation (described below) may be utilized to ascertain the specific components which are to be replaced with redundant components in order to compensate for misalignment of the first and second wafers in order to enable the memory array components of the first wafer to be appropriately coupled with circuitry along the second wafer. Example embodiments are described with reference to FIGS. 1-15.

FIGS. 1A and 1B show top views of semiconductor wafers (or wafer units) 12 and 10, respectively. One of the wafers 10 and 12 may be referred to as a first wafer and the other may be referred to as a second wafer. The terms "first" and "second" are arbitrary, and either of the wafers 10 and 12 may be the first wafer or the second wafer.

The semiconductor wafer 10 of FIG. 1B may be configured to comprise a memory cell array 14. A dashed-line 15 is provided to diagrammatically illustrate an approximate boundary of the memory cell array. The memory cell array may include memory cell active areas comprising patterned semiconductor material. The memory cell active areas may correspond to islands of semiconductor material which are laterally surrounded by isolation (e.g., shallow trench isolation, STI). The islands may be arranged in a matrix comprising rows and columns. The memory cell active areas are diagrammatically illustrated with boxes 16 (only one of which is labeled) in the view of FIG. 1B.

The wafer 10 of FIG. 1B may be considered to be a representative one of a large number of substantially identical wafers (or wafer units) along semiconductor chips (or dies) which are simultaneously processed during a wafer fabrication procedure. The term "substantially identical" means identical to within reasonable tolerances of fabrication and measurement.

The wafer 10 is shown to have a boundary region 18 which laterally surrounds the memory cell array 14, with the boundary region 18 being outward of the boundary demarcated by the line 15.

The semiconductor wafer 10 may comprise any suitable semiconductor material; and may, for example, comprise monocrystalline silicon. The semiconductor wafer 10 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In the illustrated embodiment, the wafer 10 corresponds to a semiconductor substrate containing one or more materials associated with integrated circuit fabrication. Such materials may include, for example, one or more of refractory metal materials, barrier materials, diffusion materials, insulator materials, etc.

The semiconductor wafer 12 of FIG. 1A may be configured to comprise circuitry 20 which includes circuit arrangements configured to access the memory cell array 14 (FIG. 1B) or to otherwise interact with the memory cell array. For instance, the circuitry 20 may include wordline drivers, sense amplifiers, etc. Also, the circuitry 20 may include input/output circuit arrangements configured to interact with other circuitry (not shown) external of the wafer 12. In some embodiments, the circuitry 20 may include CMOS.

The wafer 12 is shown oriented relative to X/Y axis system. The wafer includes first components 22 which are offset from the circuitry 20 along the y-axis and electrically coupled with the circuitry 20, and includes second components 24 which are offset from the circuitry 20 along the x-axis and electrically coupled with the circuitry 20. In some embodiments, the first components 22 may be utilized for coupling wordlines (i.e., access lines) associated with the memory array 14 to the circuitry 20 (e.g., to wordline drivers of the circuitry 20), and the second components 24 may be utilized for coupling bitlines (i.e., sense lines, digit lines) associated with the memory array 14 to the circuitry 20 (e.g., to sense amplifiers of the circuitry 20). The first and second components 22 and 24 may be referred to as terminal contact components, or simply as terminal contacts. In some embodiments, the first and second components 22 and 24 may be referred to as structures comprised by a circuit associated with (i.e., on, along, joined with, etc.) the second semiconductor wafer 12.

The first and second components 22 and 24 have contact regions 26 associated therewith. The contact regions are electrically connected with the components 22 and 24; and are electrically connected to the circuitry 20 through the components 22 and 24, and through interconnects (e.g., wires) 30. The contact regions 26 may be electrically coupled to structures associated with the memory array 14 (FIG. 1B), as will be discussed in more detail below.

A dashed line 17 is provided to diagrammatically illustrate an approximate boundary of the second semiconductor wafer 12.

The wafer 12 of FIG. 1A may be a representative one of a large number of substantially identical wafers (or wafer units) along semiconductor chips (or dies) which are simultaneously processed during a wafer fabrication procedure.

The semiconductor wafer 12 may comprise any suitable semiconductor material; and may, for example, comprise monocrystalline silicon. The semiconductor wafer 12 may be referred to as a semiconductor substrate. In the illustrated embodiment, the wafer 12 corresponds to a semiconductor substrate containing one or more materials associated with integrated circuit fabrication.

Figure 1C:
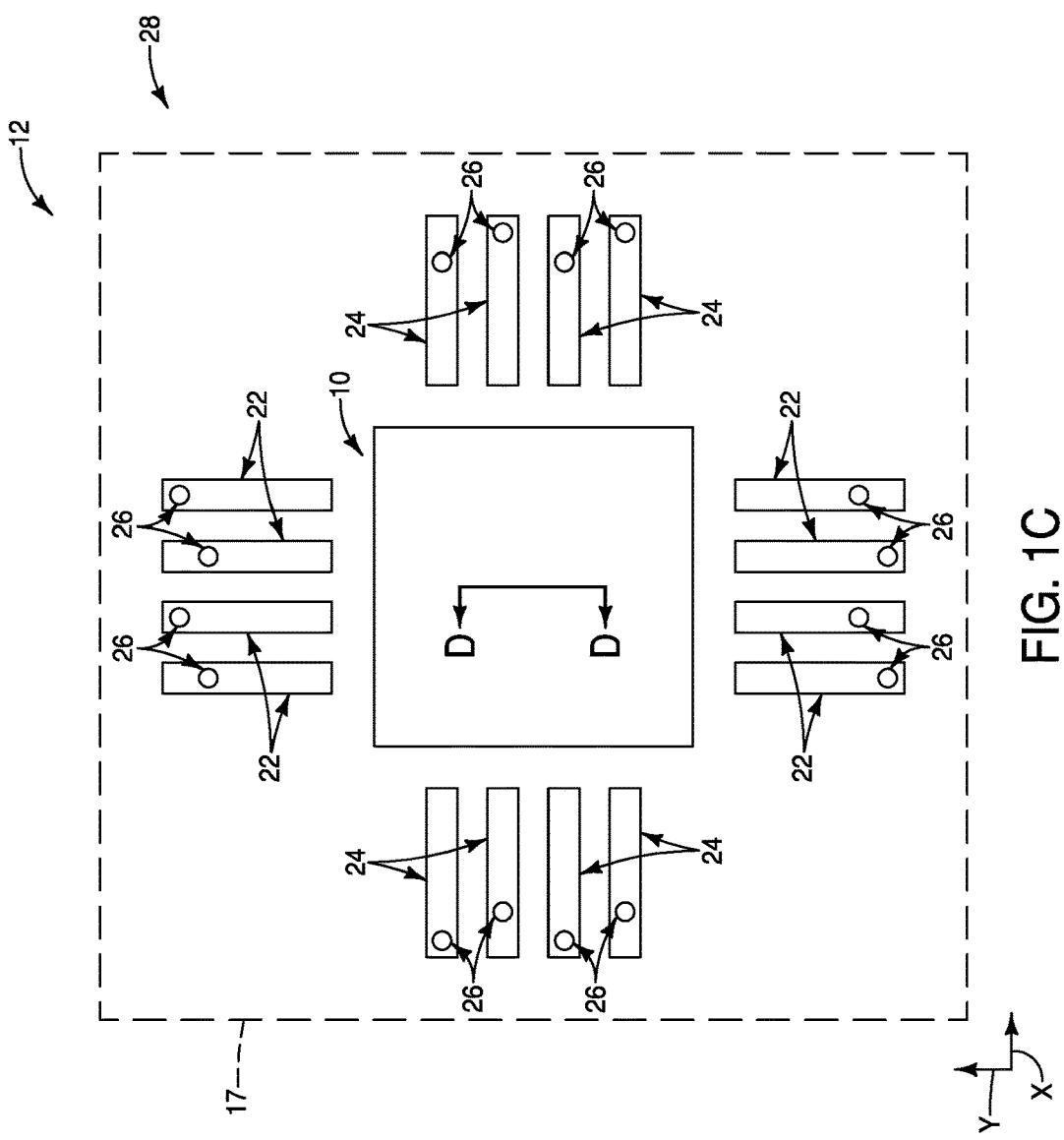

Referring to FIGS. 1C and 1D, the first wafer 10 is bonded with the second wafer 12 to form an assembly 28. The memory cell array 14 of the wafer 10 is diagrammatically indicated in the cross-sectional side view of FIG. 1D. The memory cell array 14 is not indicated in the top view of FIG. 1C in order to simplify FIG. 1C.

Figure 1E:
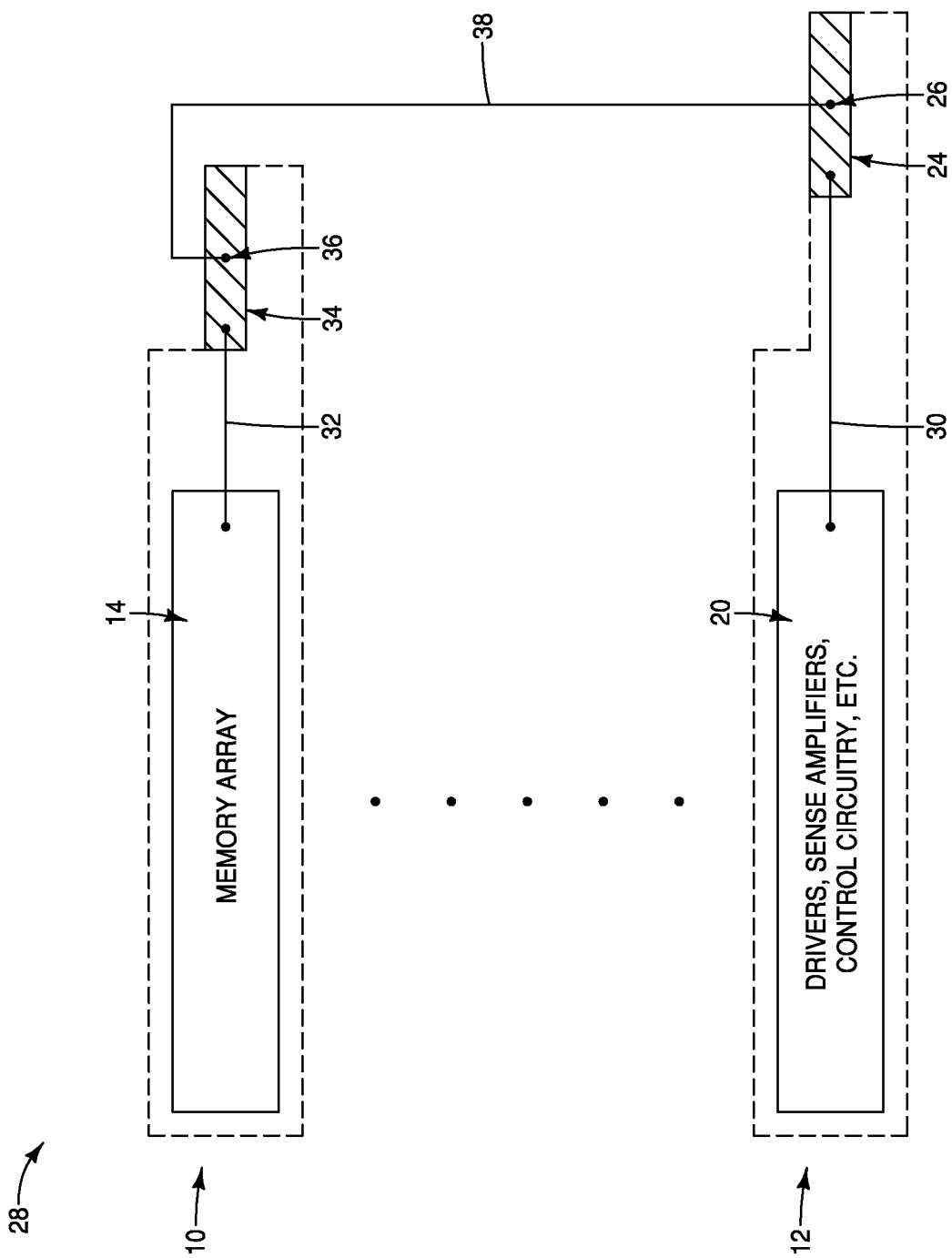
FIG. 1E is a schematic diagram illustrating an example arrangement of the bonded wafers of FIGS. 1C and 1D.

Referring to FIG. 1E, the assembly 28 is schematically illustrated. The semiconductor wafer 10 is shown to be above the semiconductor wafer 12. The semiconductor wafer 10 is shown to comprise the memory array (or memory cell array) 14, and the semiconductor wafer 12 is shown to comprise the circuitry 20 comprising drivers, sense amplifiers, control circuitry, etc.

The schematic illustration of FIG. 1E also shows one of the components 24 coupled with the circuitry 20 through one of the electrical interconnects 30. Also, the memory array 14 is shown to have an associated component 32 (e.g., a bitline) which extends to an interconnect region (or interconnect) 34. The interconnect region 34 has a contact region 36. The contact region 36 of the interconnect 34 is electrically coupled with the contact region 26 of the component 24 through a conductive interconnect (e.g., wire) 38. Some embodiments include methods for aligning first components (e.g., the bitlines 32) associated with the semiconductor wafer 10 with second components (e.g., the terminal contact components 24) associated with the semiconductor wafer 12, and to adjust for misalignment that may occur during the bonding of the wafer 10 to the wafer 12.

Figure 2B:
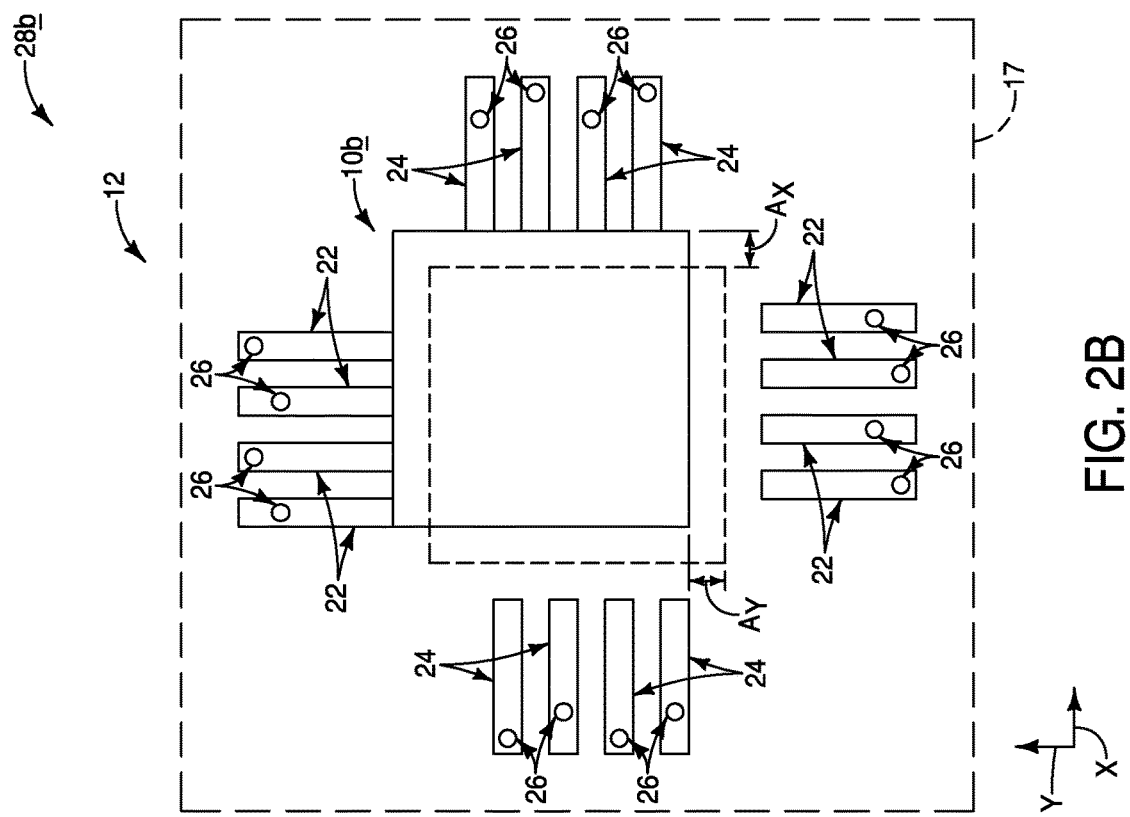
FIGS. 2A and 2B are top views of assemblies comprising the bonded first and second semiconductor wafers of FIGS. 1A and 1B.
Figure 2A:
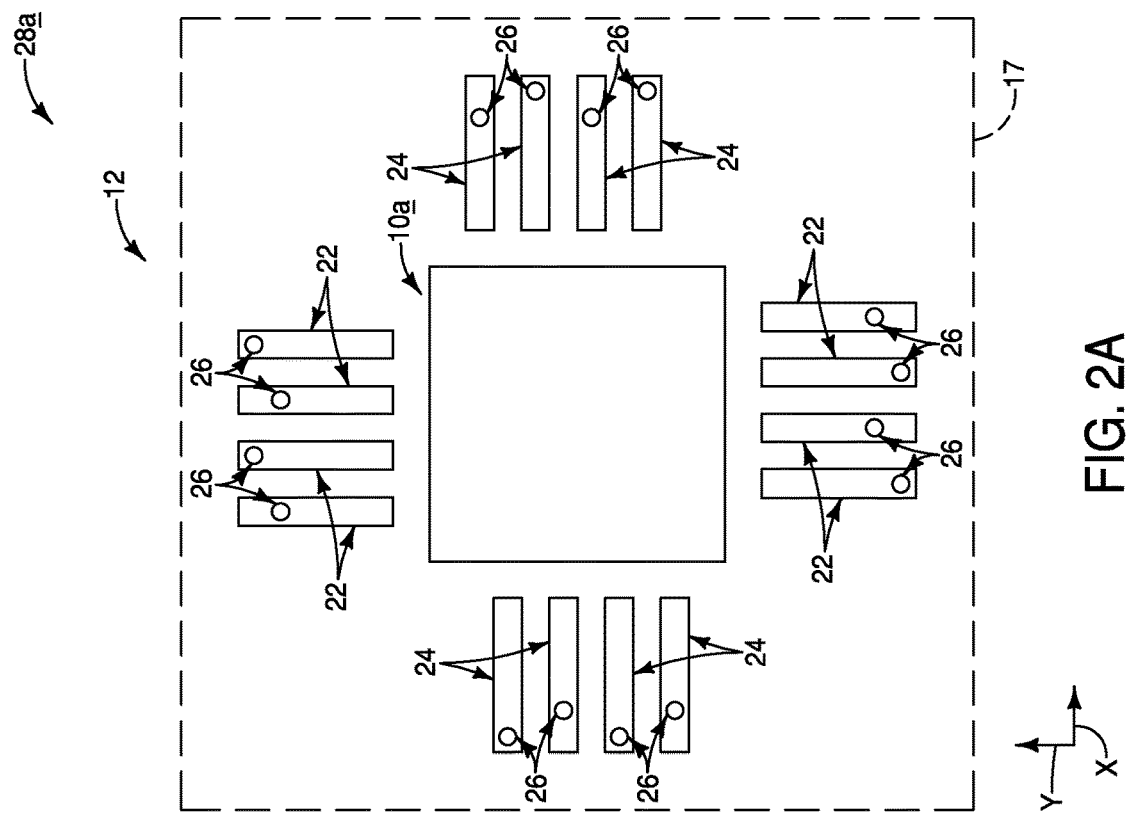

Referring to FIGS. 2A and 2B, such show assemblies 28a and 28b analogous to the assembly 28 described with reference to FIG. 1C. The assembly 28a of FIG. 2A is identical to the assembly 28 of FIG. 1C, and comprises a first wafer 10a which is perfectly aligned relative to a second wafer 12. In contrast, the assembly 28b of FIG. 2B comprises a first wafer 10b which is misaligned relative to the second wafer 12. The position of the perfectly-aligned position of wafer 10a is shown in dashed-line view in FIG. 2B for comparison to the misaligned position of the wafer 10b.

The misaligned wafer 10b is shifted from the desired perfectly-aligned position by a distance $A_Y$ along the y-axis, and by a distance $A_X$ along the x-axis. Although the wafer 10b is shown to be misaligned to about an equal extent along y-axis as along the x-axis, it is to be understood that in some applications the wafer 10b may be more misaligned along one axis than along another; and in some embodiments the wafer 10b may be relatively well-aligned along one of the x and y axes while being misaligned along the other of the x and y axes.

The shift in alignment of the first wafer 10 relative to the second wafer 12 may problematically interfere with the coupling of components of the first wafer 10 with those of the second wafer 12. Methods described herein may adjust for misalignment between the first and second wafers 10 and 12 during the coupling of components associated with wafer 10 to those associated with wafer 12. Such may enable appropriate coupling to be achieved in spite of misalignment that may occur during the bonding of the first and second wafers 10 and 12.

Although two bonded wafers are specifically described in the wafer-bonded assemblies of the embodiments shown herein, it is to be understood that analogous embodiments may have more than two wafers included in a wafer-bonded assembly.

Referring to FIGS. 3A and 3B, the assemblies 28a and 28b are shown at a processing stage subsequent to that of FIGS. 2A and 2B. Wordlines 40 are formed to extend across the memory 14 (shown in FIG. 1B) on the first semiconductor wafer (10a of FIG. 3A, and 10b of FIG. 3B). The wordlines extend along the direction of the y-axis, and in some embodiments may be considered to extend along a first direction. There may be substantially more wordlines than are illustrated in the diagrammatic illustration; and in some embodiments there may be hundreds, thousands, millions, etc., of the wordlines.

In some embodiments, the wordlines 40 may be considered to be examples of first components which are associated with the first wafers 10a and 10b, and the components 22 may be considered to be examples of second components which are associated with the second wafers 12. Ultimately, the first components 40 are to be coupled in one-to-one relation with the second components 22. Each of the first components 40 is aligned with one of the second components 22 in the configuration of FIG. 3A (i.e., in the configuration in which the first semiconductor wafer 10a is perfectly aligned with the second wafer 12). In contrast, the first components 40 are misaligned relative to the second components 22 in the configuration of FIG. 3B (i.e., in the configuration in which the first semiconductor wafer 10b is offset along the x-axis by the amount $\Delta_x$). Notably, the misalignment along the y-axis does not adversely affect the alignment of the first components 40 relative to the second components 22 in the illustrated embodiment in which the first components extend along the y-axis direction.

The wordlines 40 are along a pitch $P_1$. The second components 22 are also along the pitch $P_1$ in an overall sense; but include some components on one side of the first semiconductor wafer (10a, 10b) and on a pitch $2P_1$ utilized in combination with other components on an opposing side of the first semiconductor wafer (10a, 10b) and also on the pitch $2P_1$. In the shown embodiment, the second components 22 may be considered to include a first set 42 adjacent to a first side 43 of the first semiconductor wafer (10a, 10b), and to include a second set 44 adjacent to a second side 45 of the first semiconductor wafer (10a, 10b). The first and second sides 43 and 45 of the first semiconductor wafer (10a, 10b) are in opposing relation relative to one another.

The second components 22 of the first set 42 are along the pitch $2P_1$, and similarly the second components of the second set 44 are along the pitch $2P_1$. The first components 40 (specifically, the wordlines in the shown embodiment) may be considered to comprise a third set 46 corresponding to those wordlines which will be coupled to the components 22 of the first set 42, and to comprise a fourth set 48 corresponding to those wordlines which will be coupled to the components 22 of the second set 44. The components 40 of the third set 46 alternate with the components 40 of the fourth set 48 along the x-axis direction. In an overall sense, the second components 22 of the first and second sets 42 and 44 together correspond to an arrangement having the same pitch $P_1$ as the wordlines so that each wordline may be uniquely coupled with one of the components 22.

Figure 4A:
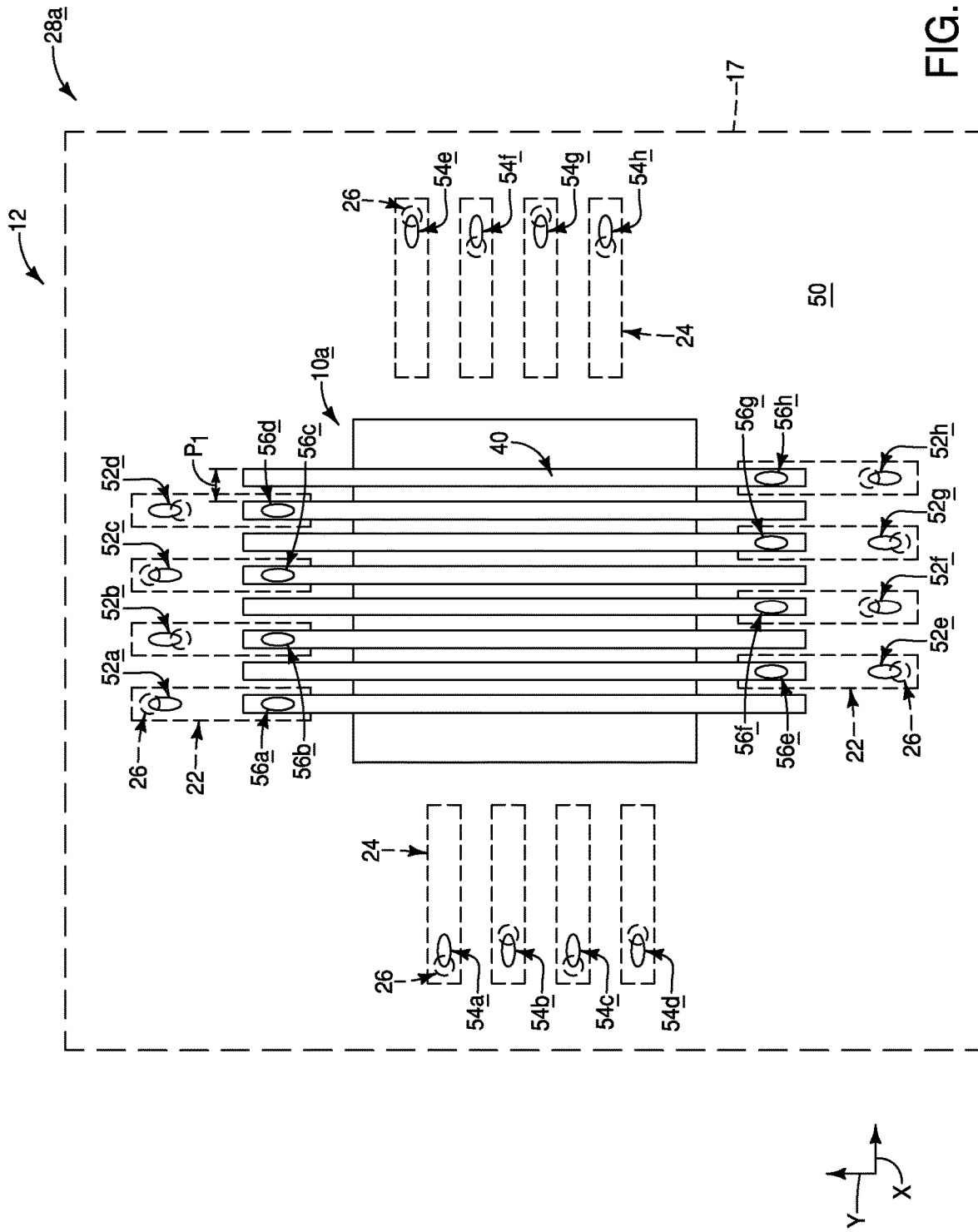

Referring to FIGS. 4A and 4B, the assemblies 28a and 28b are shown at a processing stage subsequent to that of FIG. 3. Insulative material 50 is formed over the components 22 and 24. Subsequently, openings are formed through the insulative material, and conductive contacts 52 and 54 are formed to extend into the openings. The conductive contacts 52 are electrically connected with the contact regions 26 along the first components 22, and the conductive contacts 54 are electrically connected with the contact regions 26 along the second components 24. The components 22 and 24, and the contact regions 26, are shown in dashed-line view in FIGS. 4A and 4B to indicate that they are under the insulative material 50.

The insulative material 50 may comprise any suitable composition(s); and in some embodiment may comprise, consist essentially of, or consist of silicon dioxide.

Conductive contacts 56 are also formed along the components 40 (i.e., along the wordlines 40 in the shown embodiment). The conductive contacts 54 and/or 56 may be considered to be examples of the contact 36 of FIG. 1E.

Figure 10B:
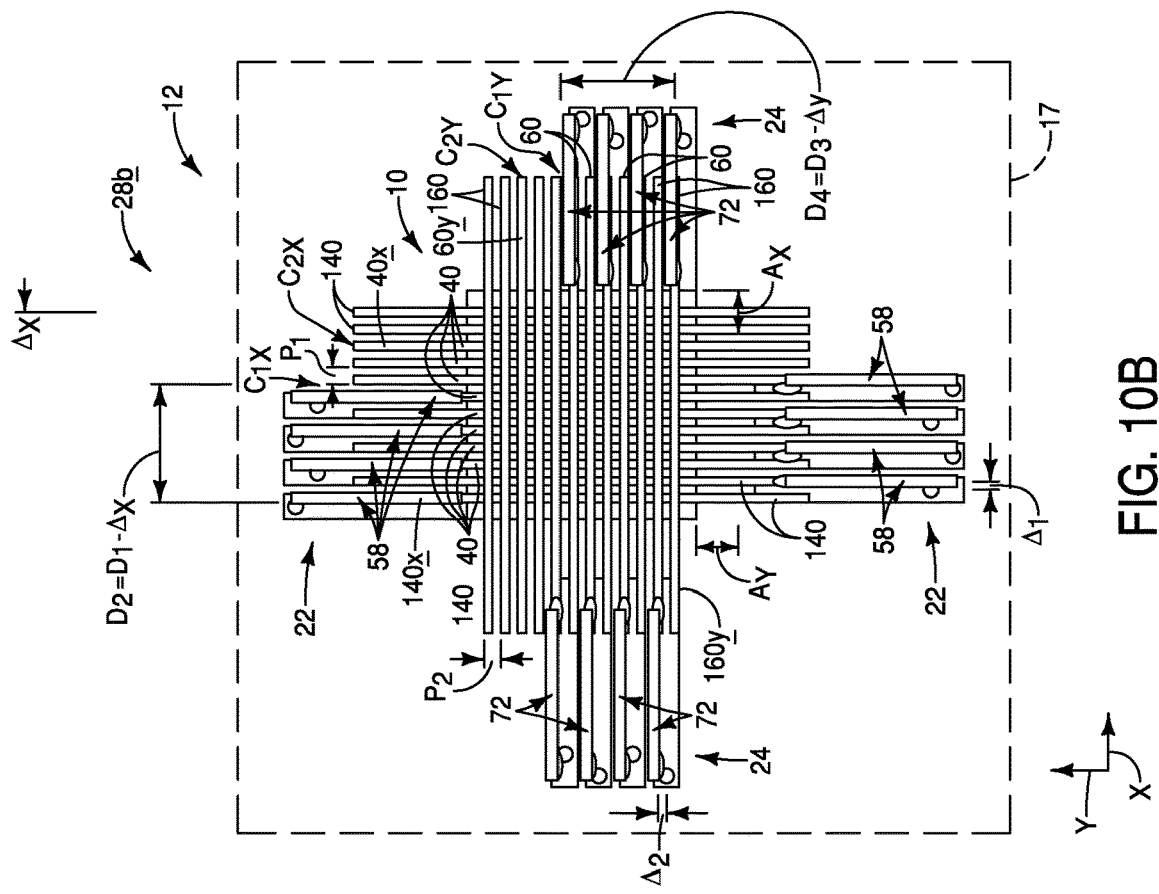
FIGS. 10A and 10B are top views of the assemblies of FIGS. 8A and 8B, respectively, at a process stage subsequent to that of FIGS. 9A and 9B.

In some embodiments, the conductive contacts 52 may be considered to be associated with (or on) the second semiconductor wafer 12, and the conductive contacts 56 may be considered to be associated with (or on) the first semiconductor wafer (10a of FIG. 4A, and 10b of FIG. 4B). The conductive contacts 52, 54 and 56 may be referred to as first, second and third conductive contacts to distinguish them from one another. The terms "first", "second" and "third" are arbitrary. In some embodiments, the conductive contacts 56 may be referred to as the first conductive contacts, and the conductive contacts 52 and 54 may referred to as the second and third conductive contacts, respectively; in other embodiments the conductive contacts 56 may be referred to as the first conductive contacts, and the conductive contacts 54 and 52 may be referred to as the second and third conductive contacts, respectively; in other embodiments the conductive contacts 54 may be referred to as the first conductive contacts, and the conductive contacts 52 and 56 may be referred to as the second and third conductive contacts, respectively; etc. The conductive contacts 52, 54 and 56 are ultimately utilized for forming electrical connections between the first wafers (10a/10b) and the second wafers 12.

In some embodiments, the contacts 56 of the configuration of FIG. 4A may be considered to be in reference positions; with such reference positions corresponding to the positions of the contacts 56 when the first wafer 10a is perfectly aligned with the second wafer 12. In contrast, the contacts 56 of the configuration of FIG. 4B are shifted from the reference positions to absorb the alignment error $A_X$ between the first and second wafers 10b and 12.

In some embodiments, each of the contacts 56 of the configuration of FIG. 4B may be considered to be linked with an associated one of the reference positions corresponding to the contacts 56 of the configuration of FIG. 4A. The individual contacts 56 of FIGS. 4A and 4B are identified as contacts 56a-h, respectively. Each contact 56 of FIG. 4A having the same label as that of FIG. 4B may be considered to be at a reference position for the contact of FIG. 4B (e.g., the contact 56a of FIG. 4A may be considered to be at a reference position for the contact 56a of FIG. 4B). The individual contacts 56 of FIG. 4B are shifted from the reference positions of FIG. 4A by an amount represented with the Greek symbol Delta ($\Delta$); and specifically indicated to be $\Delta_1$. Some embodiments include methods for ascertaining $\Delta_1$ from a known alignment shift $A_X$. The alignment shift $A_X$ can generally be estimated with a high degree of accuracy. However, difficulties are encountered in adjusting the locations of the contacts 56 relative to the alignment shift, in that the contacts 56 along the first wafer 10b must be aligned with the contacts 52 along the second wafer 12 even in applications in which the alignment shift may be substantially larger than the pitch $P_1$ (for instance, may be 2 times larger than the pitch $P_1$, three times larger than the pitch $P_1$, four times larger than the pitch $P_1$, five times larger than the pitch $P_1$, etc.).

One method of ascertaining appropriate locations for the contacts 56 in a configuration having an alignment shift between the first semiconductor wafer 10b and the second semiconductor wafer 12 (i.e., the configuration of FIG. 4B) utilizes the equations (formulas) provided below as Equations I and II.

$$C_2 = C_1 + A + P/2 - ((A+(P/2)) \bmod P) \quad \text{Equation I}$$

$$|C_2 - C_1| = |\Delta| = |A + P/2 - ((A+(P/2)) \bmod P)| \quad \text{Equation II}$$

In the above equations, $C_2$ is the new coordinate position of a feature (e.g., 56a of FIG. 4B), $C_1$ is the initial coordinate position of the feature (e.g., 56a of FIG. 4A), A is the shift in alignment of the first semiconductor wafer to the second semiconductor wafer (e.g., $A_X$ of FIG. 4B), P is the pitch of the features (e.g., $P_1$ of FIG. 4B), and (A+(P/2)) mod P is a remainder that results from dividing (A+(P/2)) by P. Also, the brackets || are utilized to indicate an absolute value, and thus $|C_2-C_1|$ is the absolute value of $C_2-C_1$. In practice, the alignment may shift to either the right or the left (i.e., to positive or negative values for the result of the operation $(C_2-C_1)$), but for purposes of explaining the methodology herein it is convenient to ignore the direction of a shift and to instead focus on only the magnitude of the shift. Thus, the value of $\Delta$ (e.g., $\Delta_1$) may be expressed as an absolute value of $\Delta$ (e.g., $|\Delta_1|$).

Example values input into, and derived from, the Equations I and II for a pitch of 34 nm are provided in Table 1 (with the values being in nanometers (nm)).

TABLE 1

| A | 0-16 | 17-33 | 34-50 | 51-67 | 68-84 | 85-101 |
|---|---|---|---|---|---|---|
| A + P/2 | 17-33 | 34-50 | 51-67 | 68-84 | 85-101 | 102-118 |
| (A + (P/2))modP | 17-33 | 0-16 | 17-33 | 0-16 | 17-33 | 0-16 |
| $\Delta$ | 0 | 34 = P | 34 = P | 68 = 2P | 68 = 2P | 102 = 3P |

A result that can be derived from Table 1 is that the shift $\Delta_1$ from the first coordinate $C_1$ to the second coordinate $C_2$ will be in integer multiples of P; and will incrementally increase as the alignment shift A increases as shown in Table 2.

TABLE 2

| A | $0 \le A < 0.5\,P$ | $0.5\,P \le A < 1.5\,P$ | $1.5\,P \le A < 2.5\,P$ | $2.5\,P \le A < 3.5\,P$ |
|---|---|---|---|---|
| $\Delta$ | 0 | P | 2 P | 3 P |

The configuration of FIGS. 4A and 4B shows the contacts 52 along the second semiconductor wafer 12 shifted in the configuration of FIG. 4B relative to the configuration of FIG. 4A. Such shift may be by the same amount $\Delta_1$ as the shift of the contacts 56, and may be calculated using Equations I and II. Also, the configuration of FIGS. 4A and 4B shows the contacts 54 along the second semiconductor wafer 12 shifted in the configuration of FIG. 4B relative to the configuration of FIG. 4A. Such shift may be by an amount $\Delta_2$ determined using Equations I and II, with A corresponding to the alignment shift $A_Y$, and with P corresponding to a pitch of bitlines (described below with reference to FIGS. 5A-5C).

Figure 5A:
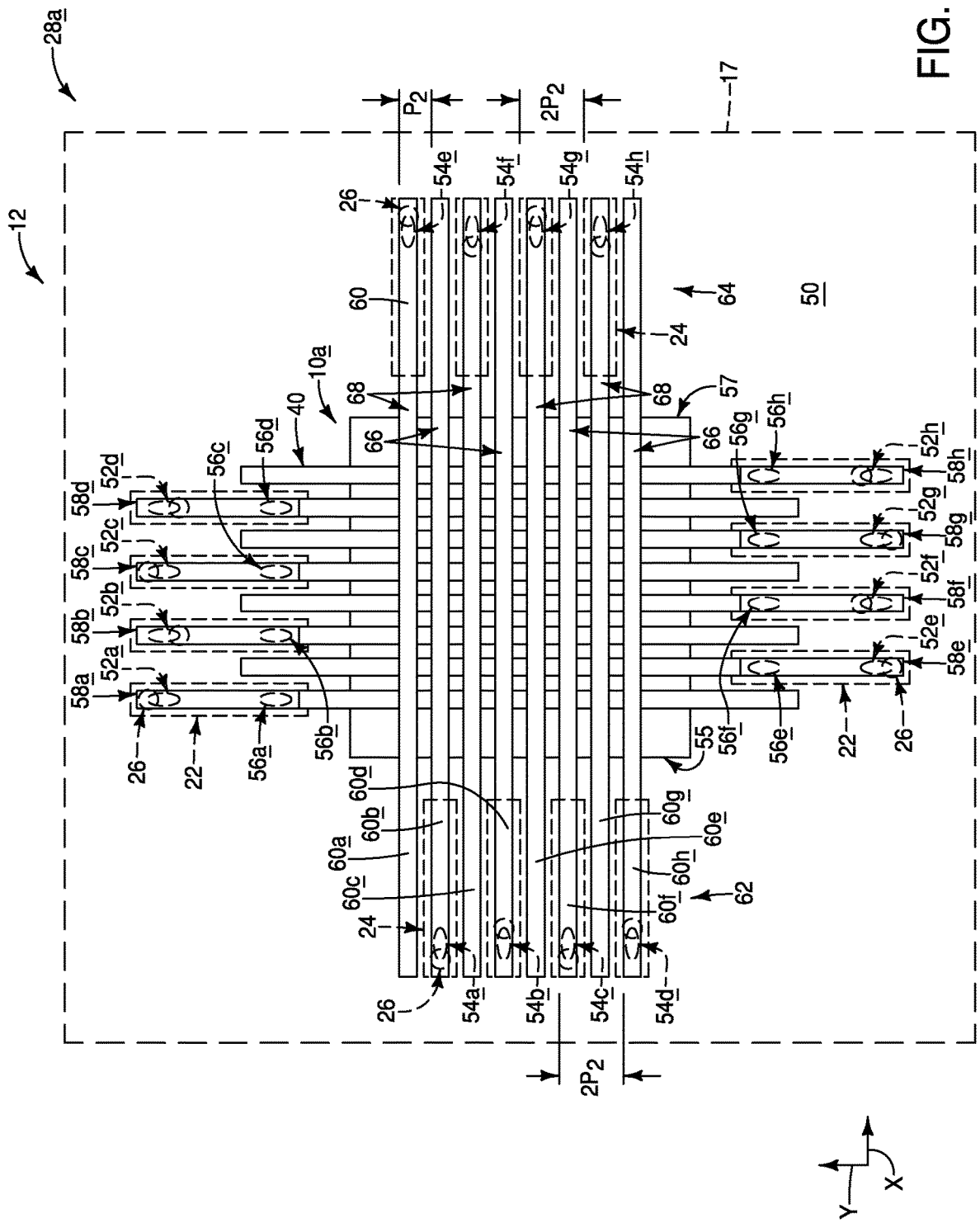
FIGS. 5A and 5B are top views of the assemblies of FIGS. 3A and 3B, respectively, at a process stage subsequent to that of FIGS. 4A and 4B.
Figure 5B:
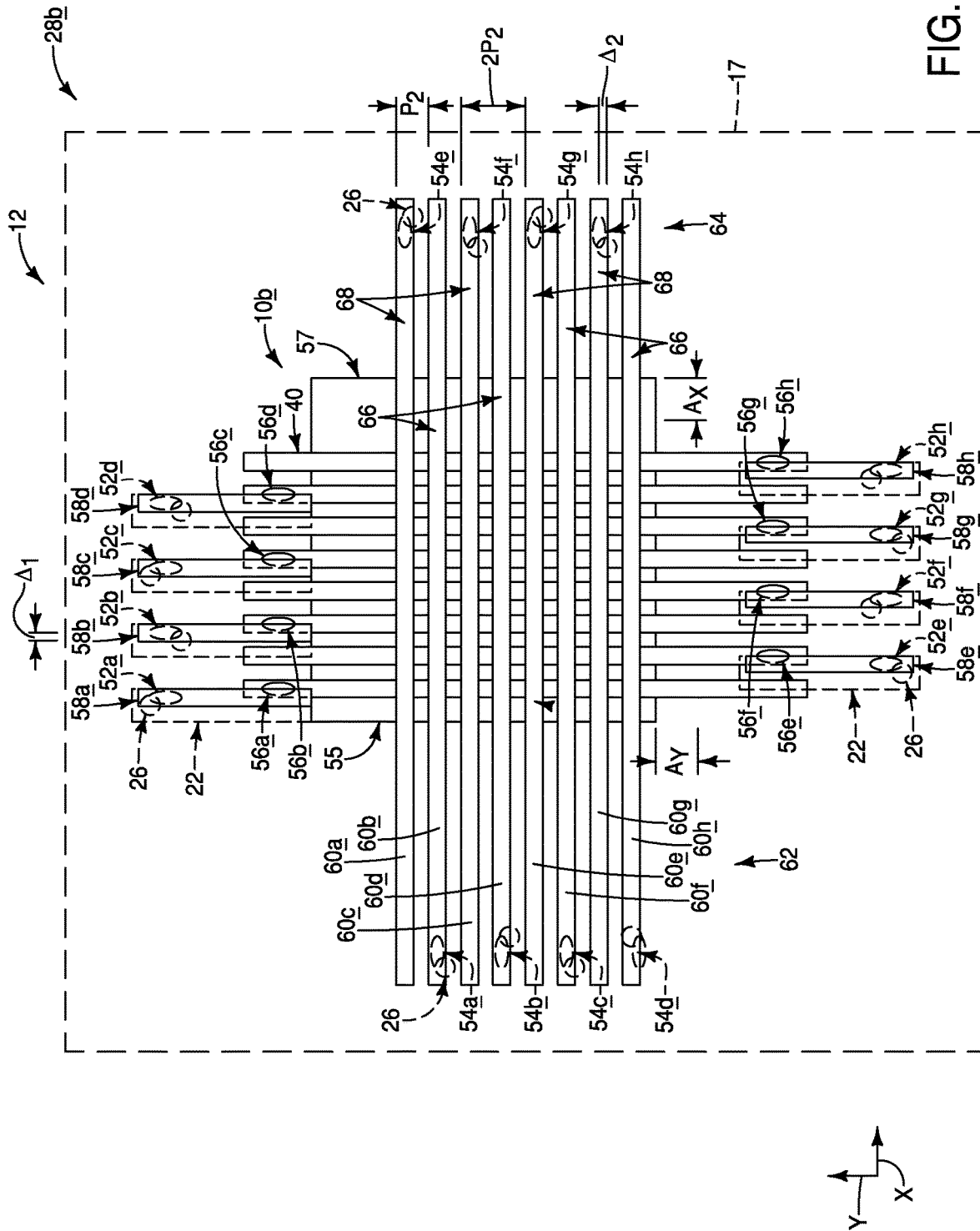

Referring to FIGS. 5A and 5B, electrical interconnects 58 are formed to extend from the first contacts 56 to the second contacts 52 (and are shown formed over the first and second contacts 56 and 52). The interconnects 58 may be analogous to the structure 38 shown in FIG. 1E. In the illustrated embodiment, the interconnects 58 are shifted in the configuration of FIG. 5B relative to the configuration of FIG. 5A. Such shift may be by the same amount $\Delta_1$ as the shift of the contacts 56, and may be calculated using Equations I and II.

Bitlines 60 are formed over the wordlines 40 and extend along a direction orthogonal to the wordlines 40. The bitlines are along a pitch $P_2$. The components (structures) 24 are also along the pitch $P_2$. The components 24 are not specifically illustrated in FIG. 5B in order to simplify the drawing (the components 24 are overlapped by the misaligned bitlines 60, and so only pieces of the components 24 would be visible in FIG. 5B). The components 24 of FIG. 5B would be present in analogous positions to those shown in FIG. 5A. The contact regions 26 adjacent the bitlines 60 are shown in FIG. 5B. Such contact regions may be considered to be associated with the components 24 that are not shown in FIG. 5B.

In the shown embodiment, the components 24 may be considered to include a first set 62 adjacent to a first side 55 of the first semiconductor wafer (10a of FIG. 5A, and 10a of FIG. 5B), and to include a second set 64 adjacent to a second side 57 of the first semiconductor wafer. The first and second sides 55 and 57 of the semiconductor wafer (10a, 10b) are in opposing relation relative to one another. There may be substantially more bitlines than are illustrated in the diagrammatic illustration; and in some embodiments there may be hundreds, thousands, millions, etc., of bitlines.

The second components of the first set 62 are along a pitch $2P_2$, and similarly the second components of the second set 64 are along the pitch $2P_2$. The first components 60 (specifically, the bitlines in the shown embodiment) may be considered to comprise a third set 66 corresponding to those bitlines which will be coupled to the components 24 of the first set 62, and to comprise a fourth set 68 corresponding to those bitlines which will be coupled to the components 24 of the second set 64. The components 60 of the third set 66 alternate with the components 60 of the fourth set 68 along the y-axis direction.

The bitlines 60 along the second semiconductor wafer 12 are shifted in the configuration of FIG. 5B relative to the configuration of FIG. 5A. Each bitline 60 of FIG. 5A having the same label as that of FIG. 5B may be considered to be at a reference position for the bitline of FIG. 5B (e.g., the bitline 60a of FIG. 5A may be considered to be at a reference position for the bitline 60a of FIG. 5B). The shift of the bitlines of FIG. 5B relative to those of FIG. 5A may be by an amount $\Delta_2$ determined using Equations I and II, with A corresponding to the alignment shift $A_y$, and with P corresponding to the pitch $P_2$ of the bitlines 60.

The bitlines 60 associated with the first semiconductor wafer (10a of FIG. 5A and 10b of FIG. 5B) are aligned with the contacts 54 along the second semiconductor wafer 12, and may be connected with such contacts 54 through interconnects analogous to the interconnect 38 described above with reference to FIG. 1E. However, it is to be understood that even though the interconnect 38 of FIG. 1E couples with an upper surface of a structure associated with the top wafer 10, in other embodiments the interconnect 38 may couple with a bottom surface of the structure associated with the top wafer (or for that matter may couple with a side surface, an end surface, or any other suitable location).

Figure 5C:
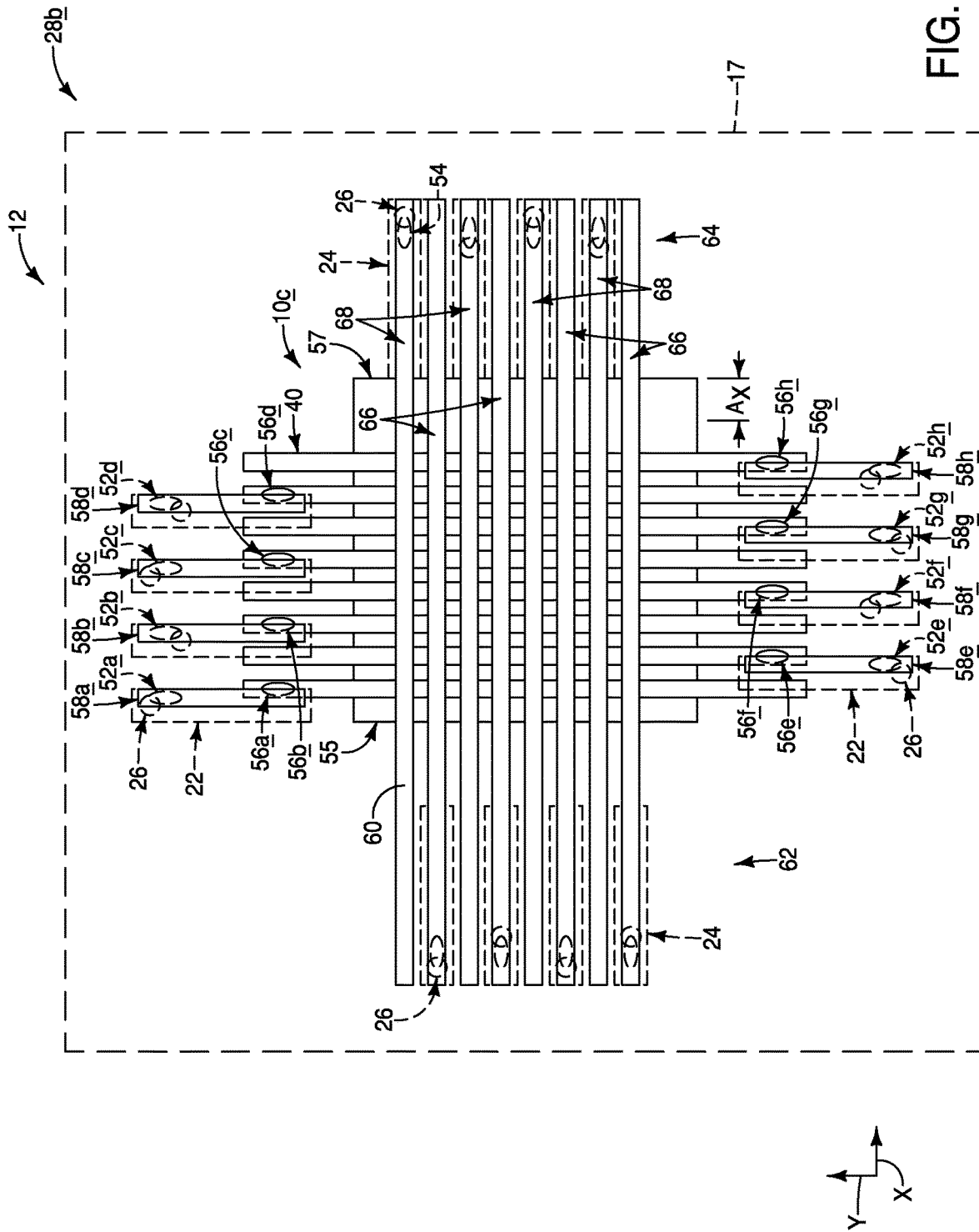
FIG. 5C is a top view of the assembly of FIG. 3B at a process stage subsequent to that of FIG. 4B and alternative to that of FIG. 5B.

FIG. 5C shows an embodiment analogous to that of FIG. 5B, but in which a first semiconductor wafer 10c shifts only along the x-axis direction during the wafer bonding of the first semiconductor wafer to the second semiconductor wafer 12. Accordingly, the bitlines 60 are not shifted relative to the reference locations of FIG. 5A; but the contacts 52 and 56 are shifted relative to the reference locations of FIG. 5A, and the interconnects 58 are shifted relative to the reference locations of FIG. 5A.

In some embodiments, the shift in alignment of the first wafer 10 relative to the second wafer 12 during wafer bonding may be compensated by, at least in part, providing redundant circuitry associated with the first wafer. In some embodiments, the redundant circuitry may be provided within the boundary region 18 (described above with reference to FIG. 1B).

FIGS. 6A-6F illustrate example processing utilizing redundant wordlines. The initial wordlines 40 are shown with solid outer peripheries. The redundant wordlines 140 are shown with dashed-line peripheries so that they may be distinguished from the initial wordlines 40. The redundant wordlines 140 are configured together with additional circuitry associated with the memory array 14 so that the redundant wordlines may replace the initial wordlines of the memory array if such is necessary to compensate for misalignment incurred during a wafer-bonding process.

Referring to FIG. 6A, the components 22 are associated with the second wafer 12; and the wordlines 40 and redundant wordlines 140 are associated with the first wafer 10. The first wafer is aligned perfectly with the second wafer (i.e., $A_x$=0). Accordingly, the contacts 52 may be formed along the wordlines 40 (as shown) in that such contacts will be properly aligned with the components 22 along the second wafer 12.

The first wafer 10 becomes increasingly misaligned relative to the second wafer 12 in progressing from FIG. 6A to FIG. 6F. Accordingly, the locations of the wordlines 40 shift relative to the locations of the components 22. Eventually, one or more of the wordlines 40 becomes misaligned relative to the components 22 to the extent that it can no longer be coupled with any of the components 22, and simultaneously one or more of the redundant wordlines 140 becomes aligned relative to the components 22 so that it can now be coupled with one of the components 22. The relative amount of the shift of the wordlines relative to the components 22 may be calculated with the Equations I and II described above, and such equations may also be utilized to determine which redundant wordlines should be utilized in place of the initial wordlines. As redundant wordlines become aligned with the components 22 to replace initial wordlines, the contact locations 56 are provided on the redundant wordlines instead of on the replaced initial wordlines.

FIGS. 6G-6L illustrate example processing utilizing redundant bitlines. The initial bitlines 60 are shown with solid outer peripheries. The redundant bitlines 160 are shown with dashed-line peripheries so that they may be distinguished from the initial bitlines 60. The redundant bitlines 160 are configured together with additional circuitry associated with the memory array 14 so that the redundant bitlines may replace the initial bitlines of the memory array if such is necessary to compensate for misalignment incurred during a wafer-bonding process.

Figure 6G:
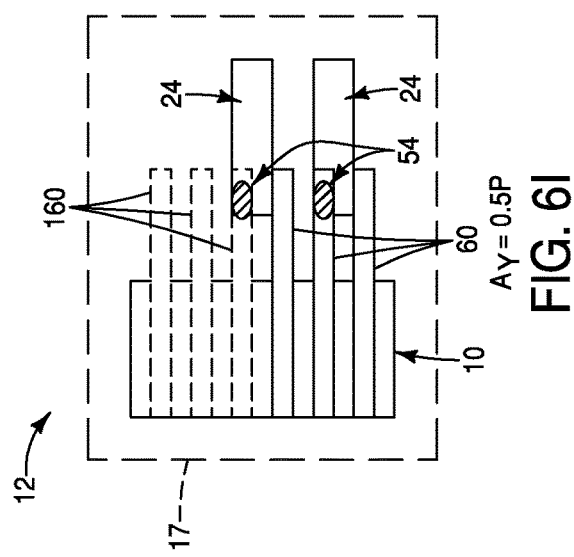
FIGS. 6G-6L are top views of an assembly having bonded wafers, and illustrate varying degrees of y-axis misalignment between the wafers.
Figure 6I:
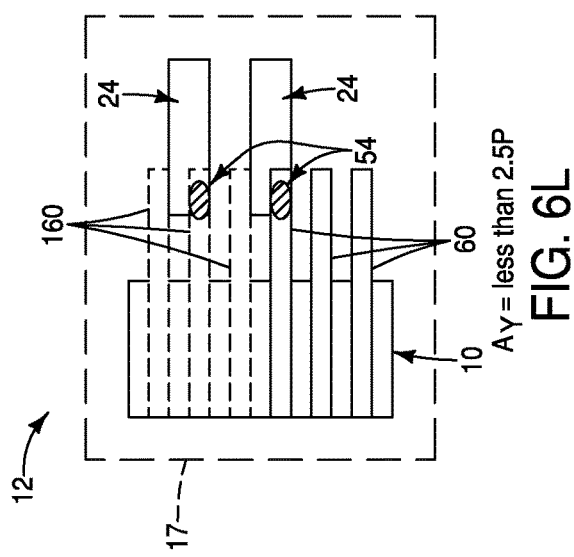
Figure 6H:
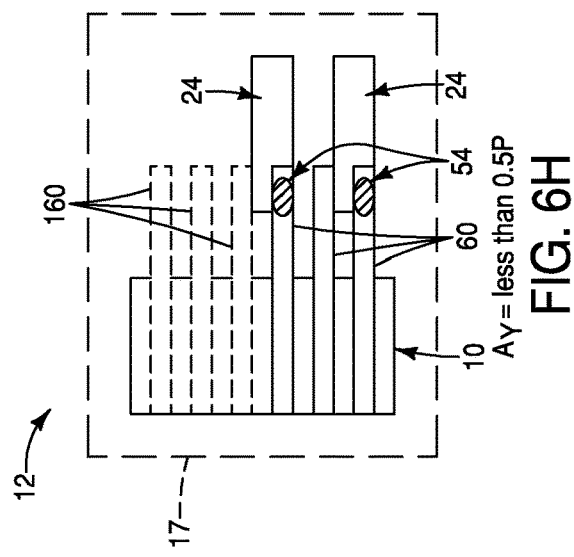
Figure 6K:
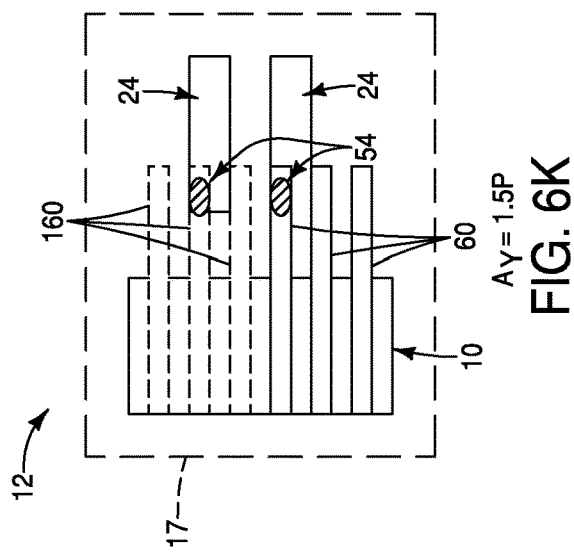
Figure 6J:
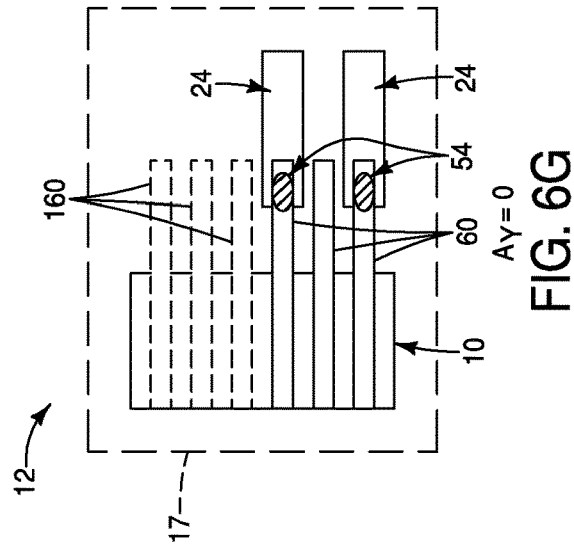
Figure 6L:
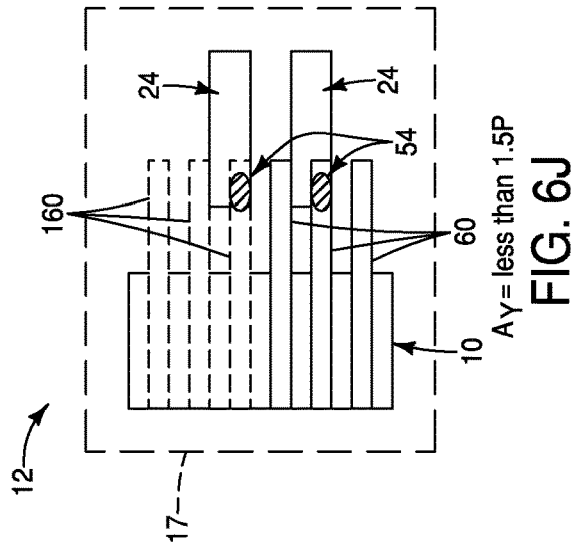

Referring to FIG. 6G, the components 24 are associated with the second wafer 12; and the bitlines 60 and redundant bitlines 160 are associated with the first wafer 10. The first wafer is aligned perfectly with the second wafer (i.e., $A_y$=0), and accordingly the contacts 54 couple with the initial bitlines 60 (as shown).

The first wafer 10 becomes increasingly misaligned relative to the second wafer 12 in progressing from FIG. 6G to FIG. 6L. Accordingly, the locations of the bitlines 60 shift relative to the locations of the components 24. Eventually, one or more of the bitlines 60 becomes misaligned relative to the components 24 to the extent that it can no longer be coupled with any of the components 24, and simultaneously one or more of the redundant bitlines 160 becomes aligned relative to the components 24 so that it can now be coupled with one of the components 24. The relative amount of the shift of the bitlines relative to the components 24 may be calculated with the Equations I and II described above, and such equations may also be utilized to determine which redundant bitlines should be utilized in place of the initial bitlines. As redundant bitlines become aligned with the components 24 to replace initial bitlines, the contact locations 54 become aligned with the redundant bitlines instead of with the replaced initial bitlines.

The embodiments of FIGS. 3-5 formed the wordlines 40 and bitlines 60 after the first and second wafers 10 and 12 were bonded. In other embodiments, the bitlines 60 and/or the wordlines 40 may be formed before the wafers 10 and 12 are bonded.

Figure 7B:
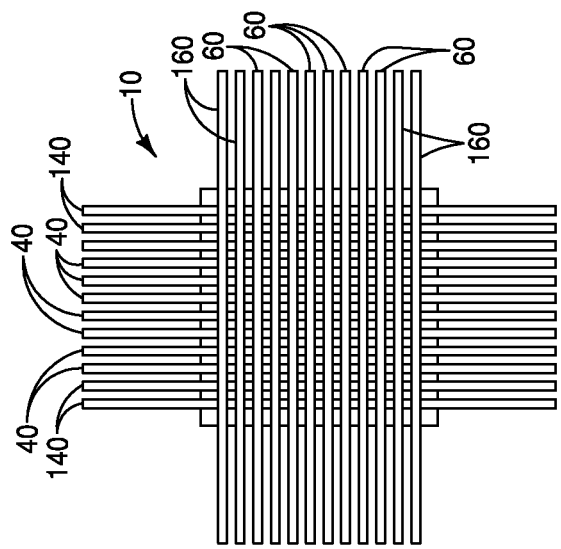
FIGS. 7A and 7B are diagrammatic top views of regions of first and second semiconductor wafers, respectively.
Figure 7A:
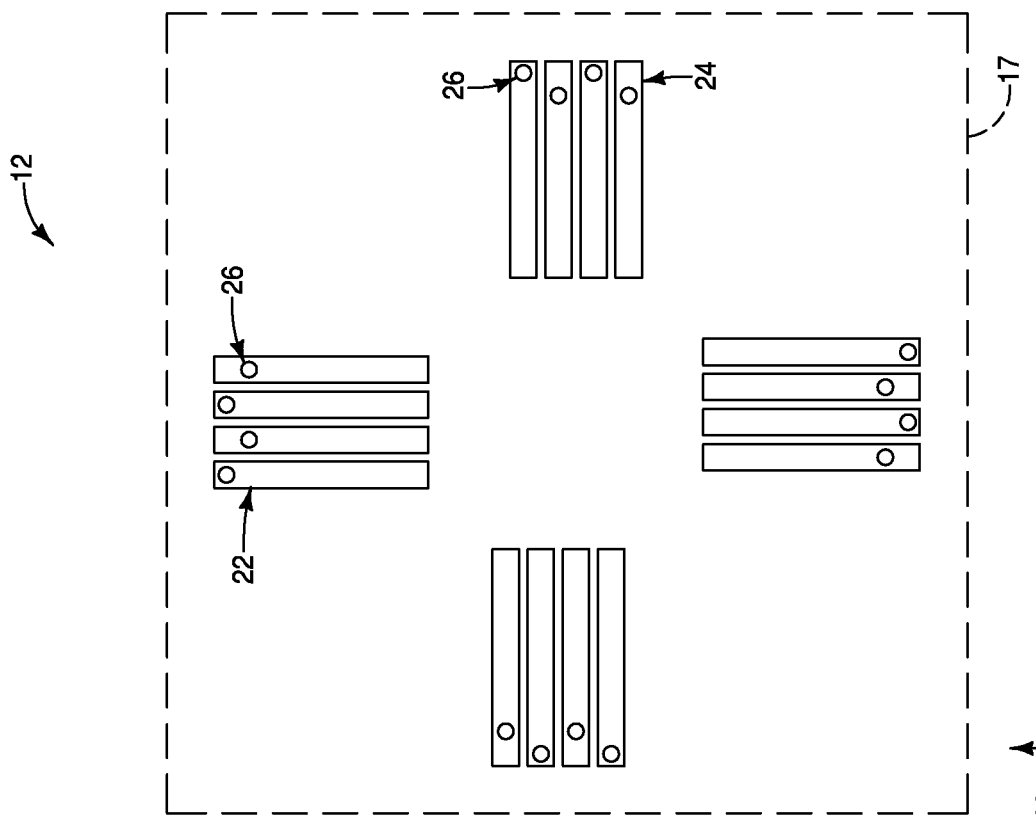

Referring to FIGS. 7A and 7B, a first wafer 10 (FIG. 7B) and a second wafer 12 (FIG. 7A) are illustrated. The first wafer 10 has the wordlines 40 and bitlines 60 formed thereon. Also, redundant wordlines 140 are formed on the first wafer 10, as are redundant bitlines 160. The wordlines 40, bitlines 60, redundant wordlines 140 and redundant bitlines 160 may extend across memory array circuitry. The second wafer 12 comprises the components (structures) 22 and 24, and the conductive contacts 26 associated with such components. Although four redundant wordlines 140 and four redundant bitlines 160 are illustrated, it is to be understood that the configuration may have any suitable number of redundant bitlines and redundant wordlines; and may have more than the illustrated number of redundant wordlines and/or redundant bitlines, or may have less than the illustrated number of redundant wordlines and/or redundant bitlines. Also, there may be substantially more wordlines and bitlines than are illustrated in the diagrammatic illustration; and in some embodiments there may be hundreds, thousands, millions, etc., of wordlines, and an approximately equal number of bitlines.

Figure 8B:
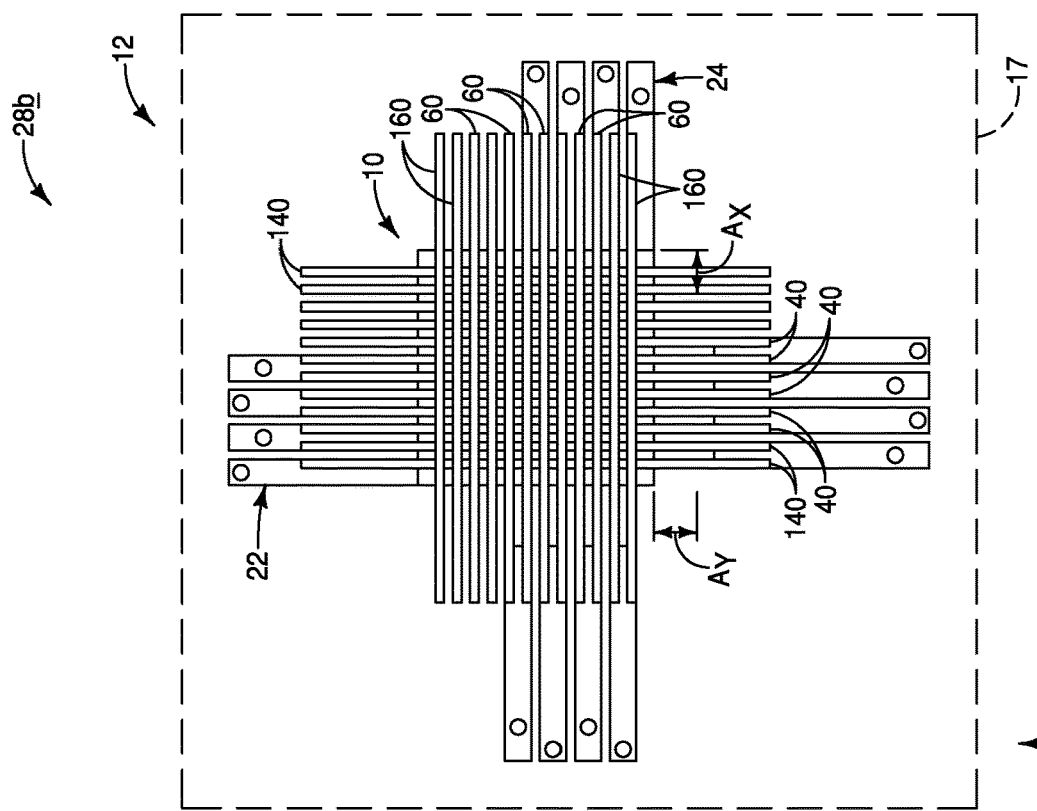
FIGS. 8A and 8B are top views of assemblies comprising the first and second wafers of FIGS. 7A and 7B bonded to one another.
Figure 8A:
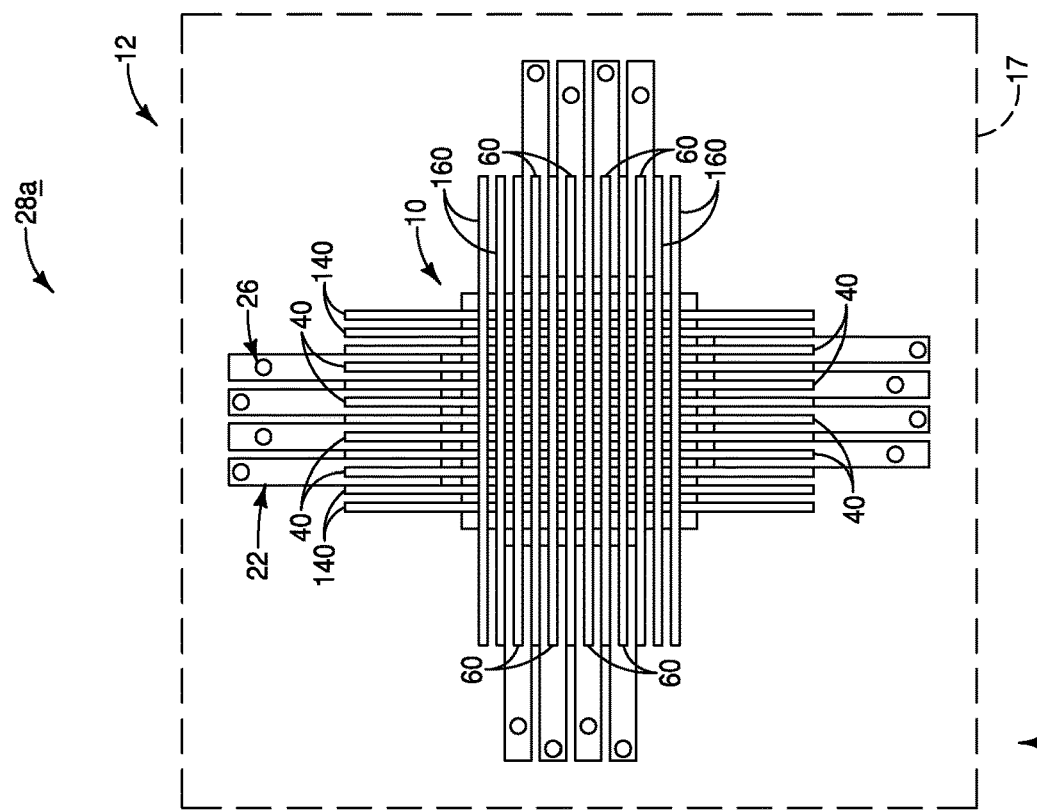

Referring to FIGS. 8A and 8B, the first and second wafers are bonded together to form the assembly 28a (FIG. 8A) or the assembly 28b (FIG. 8B).

The assembly 28a has the first wafer 10 perfectly aligned relative to the second wafer 12. Accordingly, the primary (initial) wordlines 40 are aligned with the components 22, and the redundant wordlines 140 are not aligned with the components 22. Similarly, the primary (initial) bitlines 60 are aligned with the components 24, and the redundant bitlines 160 are not aligned with the components 24.

In contrast to the assembly 28a, the assembly 28b has the first wafer 10 misaligned relative to the second wafer 12. Accordingly, two of the redundant wordlines 140 are now aligned with components 22 and replace two of the initial wordlines 40. Similarly, two of the redundant bitlines 160 are now aligned with components 24 and replace two of the initial bitlines.

The specific wordlines 40 and bitlines 60 replaced in the assembly 28b may be determined utilizing the Equations I and II described previously in this disclosure, as can the specific redundant wordlines 140 and redundant bitlines 140 that will replace them.

Figure 9B:
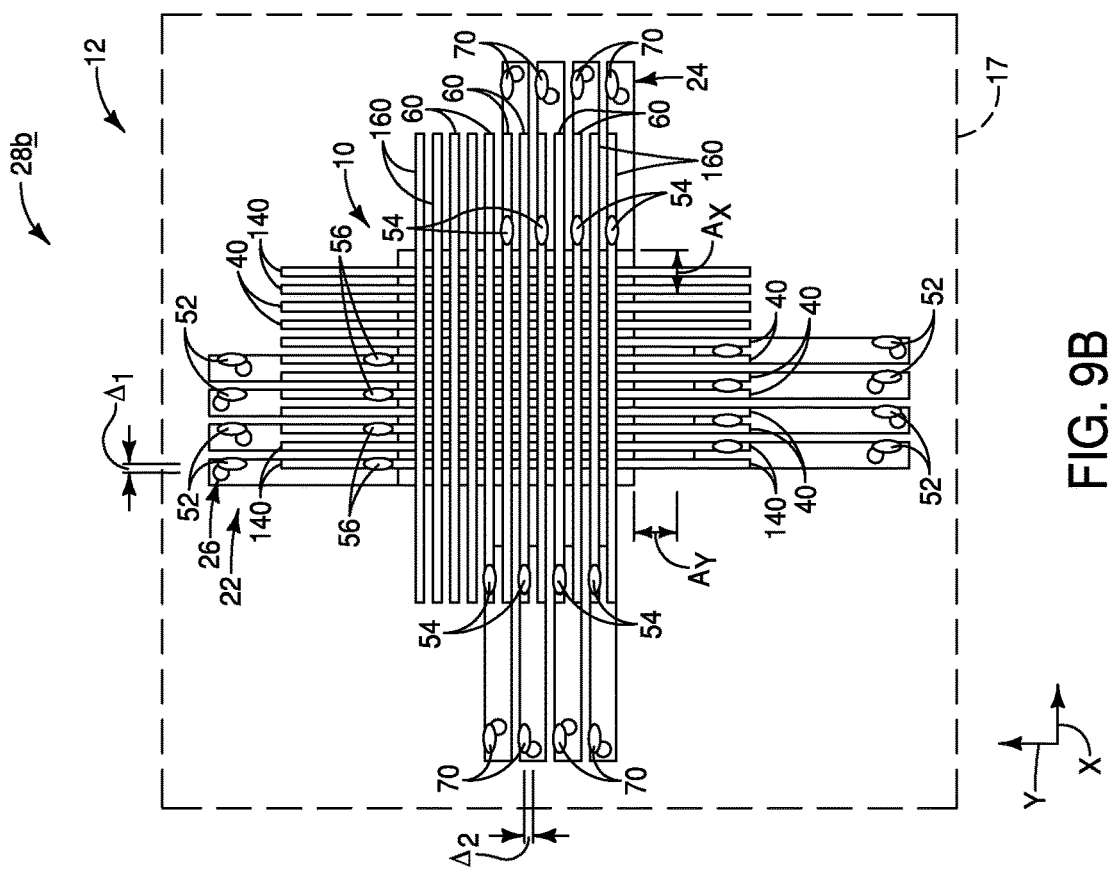
FIGS. 9A and 9B are top views of the assemblies of FIGS. 8A and 8B, respectively, at a process stage subsequent to that of FIGS. 8A and 8B.
Figure 9A:
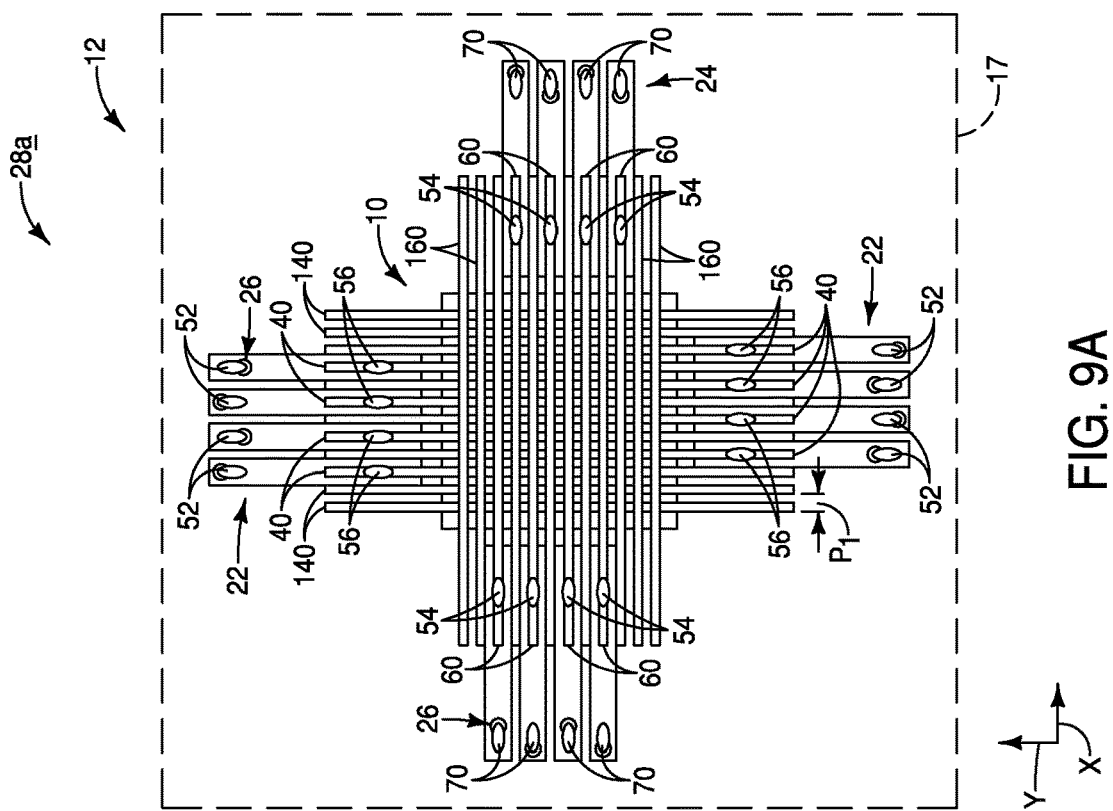

Referring to FIGS. 9A and 9B, contacts 54 are formed along the bitlines/redundant bitlines (60/160) aligned with components 24, and contacts 56 are formed along the wordlines/redundant wordlines (40/140) aligned with the components 22. The locations of the contacts 54 and 56 of assembly 28b may be determined utilizing the Equations I and II described previously in this disclosure.

FIGS. 9A and 9B also show the contacts 52 formed along the components 22, and show analogous contacts 70 formed along the components 24. The locations of the contacts 52 and 70 of assembly 28b may be determined utilizing the Equations I and II described previously in this disclosure.

In some embodiments, the assembly 28b of FIG. 9B may be considered to comprise a first bonding alignment error $A_X$ and a second bonding alignment error $A_Y$. The contacts 52 and 56 may be considered to be first contacts provided for forming first electrical connections between the first and second semiconductor wafers 10 and 12, and similarly the contacts 54 and 70 may be considered to be second contacts provided for forming second electrical connections between the first and second semiconductor wafers 10 and 12. The first contacts 52 and 56 of FIG. 9B are shifted from their associated reference positions (with such reference positions being the locations of the contacts 52 and 56 in FIG. 9A) by an amount associated the first bonding alignment error $A_X$; and the second contacts 54 and 70 of FIG. 9B are shifted from their associated reference positions (with such reference positions being the locations of the contacts 54 and 70 in FIG. 9A) by an amount associated with the second bonding alignment error $A_Y$. The appropriate positions of the first and second contacts within the configuration of FIG. 9B may be determined using the Equations I and II described previously in this disclosure.

The description above refers to the contacts 52 and 56 as first contacts, and to the contacts 54 and 70 as second contacts. Alternatively, the first contacts may be considered to be the contacts 54 and 70, and the second contacts may be considered to be the contacts 52 and 56.

Figure 10A:
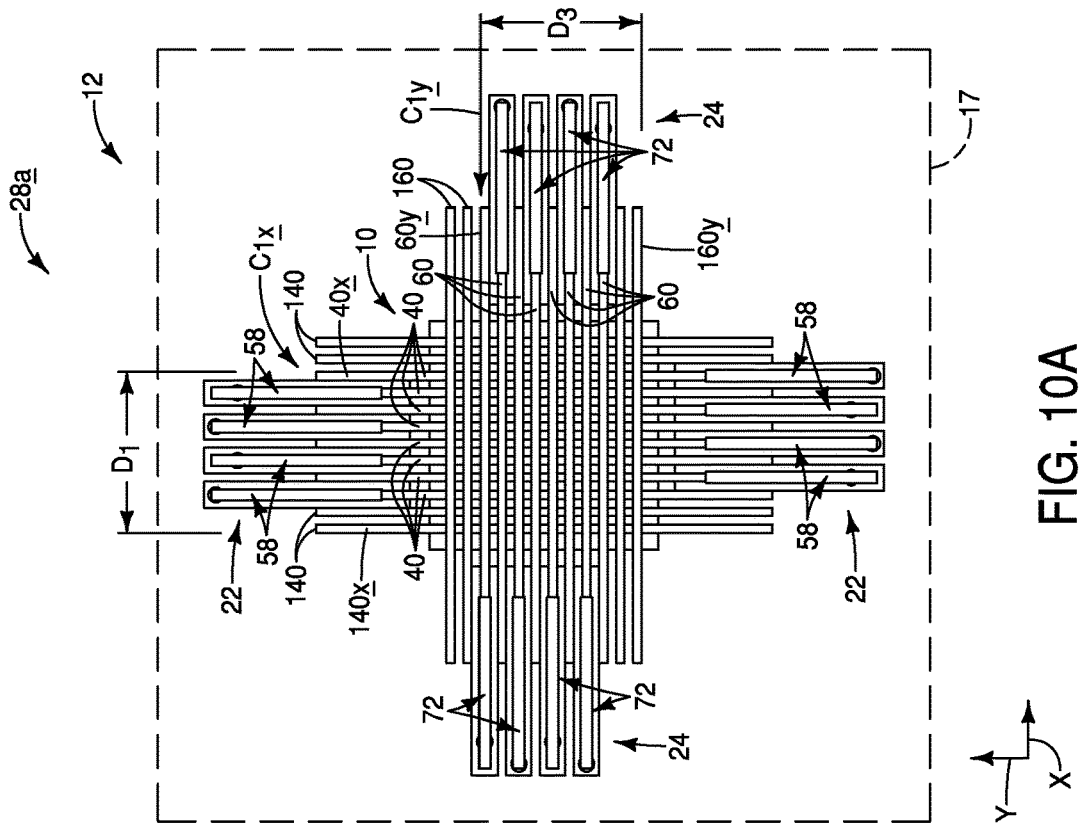

Referring to FIGS. 10A and 10B, interconnects 58 are formed to electrically couple (i.e., electrically connect) the contacts 56 and 52 (FIGS. 9A and 9B) with one another, and analogous interconnects 72 are formed to electorally couple the contacts 54 and 70 (FIGS. 9A and 9B) with one another.

Locations of the interconnects 58 and 72 of FIG. 10B may be determined utilizing the Equations I and II discussed previously in this disclosure. In some embodiments, the contacts 52 and 56 of assembly 28b (shown in FIG. 9B) may be considered to be shifted relative to associated contact reference positions (shown relative to the assembly 28a in FIG. 9A) by a dimension $\Delta_1$. The electrical interconnects 58 of FIG. 10B may be shifted by the same dimension $\Delta_1$ relative to associated reference dimensions shown in FIG. 10A. Analogously, the contacts 54 and 70 of FIG. 9B may be shifted relative to reference positions of the same contacts in FIG. 9A by a dimension $\Delta_2$, and the electrical interconnects 72 of FIG. 10B may be shifted by the same dimension $\Delta_2$ relative to associated electrical interconnects reference positions shown in FIG. 10A.

In some embodiments, the first wafer 10 may be considered to comprise first circuitry which includes the wordlines 40 as first components along a pitch $P_1$ (which may be referred to generically as a pitch P in some embodiments). The second wafer 12 may be considered to comprise second circuitry which includes the second components 22 also along the pitch $P_1$ (with the relationship between the pitch of the wordlines and the pitch of the second components being described above with reference to FIGS. 3A and 3B). The redundant wordline components 140 may be considered to be redundant first components along the first semiconductor wafer 10. At least one of the redundant wordline components 140 is electrically coupled with one of the second components 22 through an interconnect 58.

Alternatively, the bitlines 60 may be considered to be the first components of the first circuitry of the first wafer 10, and the components 24 may be considered to be the second components of the second circuitry of the second wafer 12. The first and second components 60 and 24 are along a pitch $P_2$, which may be generically referred to as the pitch P. The redundant bitline components 160 may be considered to be the redundant first components along the first semiconductor wafer 10. At least one of the redundant bitline components 160 is electrically coupled with one of the second components 24 through an electrical interconnect 72.

In some embodiments, the first semiconductor wafer 10 of the assembly 28b of FIG. 10B is shifted from alignment with the second semiconductor wafer 12 of the assembly by a distance $A_x$ along the x-axis direction, and by a distance $A_y$ along the y-axis direction. A representative wordline component 40x has an intended x-axis coordinate position $C_{1x}$ (shown in FIG. 10A), and a representative one of the bitline components 60y has an intended y-axis coordinate position $C_{1y}$ (shown in FIG. 10A). The wordline coupling components 22 are electrically coupled with some the wordline components 60 through the electrical interconnects 58. The electrical connection of the wordline coupling components 22 with the wordline components 40 includes compensating for the shift from alignment along the x-axis by an amount in accordance with Equation III.

$$C_{2x} = C_{1x} + A_x + P_1/2 - ((A_x + (P_1/2)) \bmod P_1) \qquad \text{Equation III}$$

In Equation III, $C_{2x}$ is a new x-axis coordinate for the representative one of the wordline components (40x), and $(A_x + (P_1/2)) \bmod P_1$ is a remainder obtained by dividing $(A_x + (P_1/2))$ by $P_1$.

A dimension $\Delta_x$ is defined to be the value of $C_{2x} - C_{1x}$; and has an absolute value greater than $0.5P_1$. One of the redundant wordline components is identified as 140x. The redundant wordline component 140x is shifted relative to $C_{1x}$ by a distance of $\Delta_x$ due to the alignment shift; and is electrically connected with the one of the wordline coupling components 22. The shift of 140x is shown in FIGS. 10A and 10B by showing a distance from 140x to $C_{1x}$ in FIG. 10A of $D_1$ (i.e., the distance between 140x and $C_{1x}$ in an aligned configuration), and by showing a distance from 140x to $C_{1x}$ in FIG. 10B of $D_2$; where $D_2=D_1-\Delta_x$.

The electrical coupling of the bitline coupling components 24 with the bitline components 60 includes compensating for the shift from alignment along the y-axis by an amount in accordance with Equation IV.

$$C_{2y}=C_{1y}+A_{y+}P_2/2-((A_y+(P_2/2))\bmod P_2) \quad \text{Equation IV}$$

In Equation IV, $C_{2y}$ is a new y-axis coordinate for the representative one of the bitline components (60y), and $(A_y+(P_2/2)) \bmod P_2$ is a remainder obtained by dividing $(A_y+(P_2/2))$ by $P_2$.

A dimension $\Delta_y$ is defined to be the value of $C_{2y}-C_{1y}$; and has an absolute value greater than $0.5P_2$. A redundant bitline component 160y is shifted relative to $C_{1y}$ by a distance of $\Delta_y$ due to the alignment shift; and is electrically connected with the one of the bitline coupling components 24. The shift of 160y is shown in FIGS. 10A and 10B by showing a distance from 160y to $C_{1y}$ in FIG. 10A of $D_3$ (i.e., the distance between 160y and $C_{1y}$ in an aligned configuration), and by showing a distance from 160y to $C_{1y}$ in FIG. 10B of $D_4$; where $D_4=D_3-\Delta_y$.

The embodiment of FIGS. 7-10 shows the wordline components 40 and the bitline components 60 both formed before the bonding of the first semiconductor wafer 10 to the second semiconductor wafer 12. In other embodiments, the redundant wordline components and/or the redundant bitline components may be utilized in applications in which either the wordline components or the bitline components are formed after the bonding of the first wafer 10 to the second wafer 12. For instance, FIGS. 11-15 describe an example embodiment in which the bitline components are formed on the first semiconductor wafer prior to bonding the first and second wafers to one another, and then the wordline components are formed.

Figure 11B:
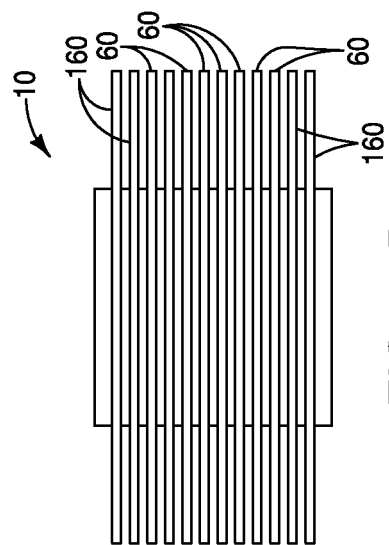
FIGS. 11A and 11B are diagrammatic top views of regions of first and second semiconductor wafers, respectively.
Figure 11A:
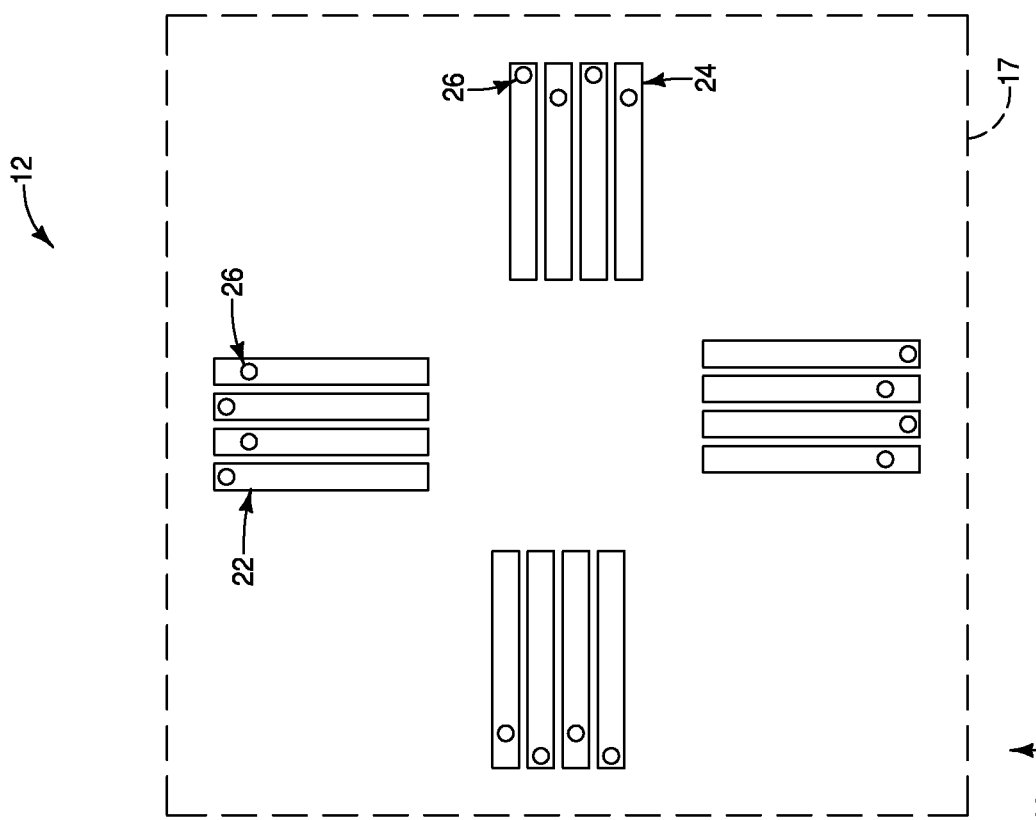

Referring to FIGS. 11A and 11B, a first wafer 10 (FIG. 11B) and a second wafer 12 (FIG. 11A) are illustrated. The first wafer 10 has the bitlines 60 and the redundant bitlines 160 formed thereon.

Figure 12A:
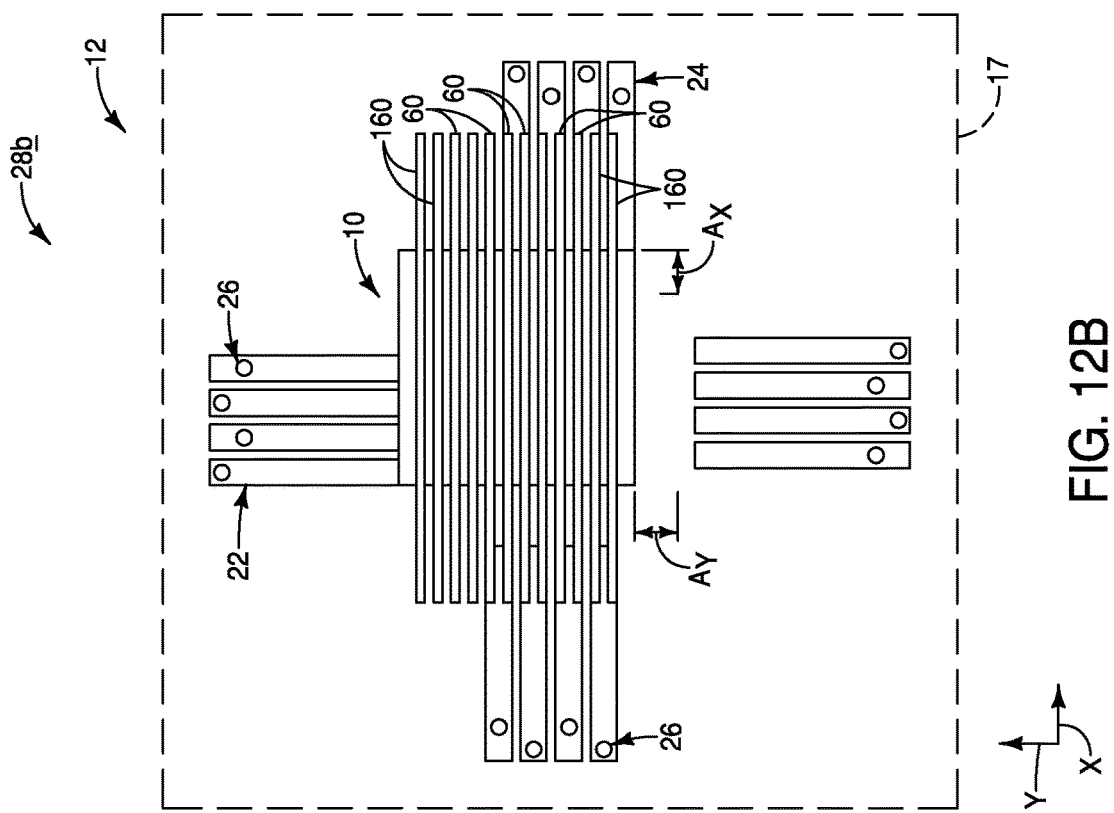
FIGS. 12A and 12B are top views of assemblies comprising the first and second wafers of FIGS. 11A and 11B bonded to one another.
Figure 12B:
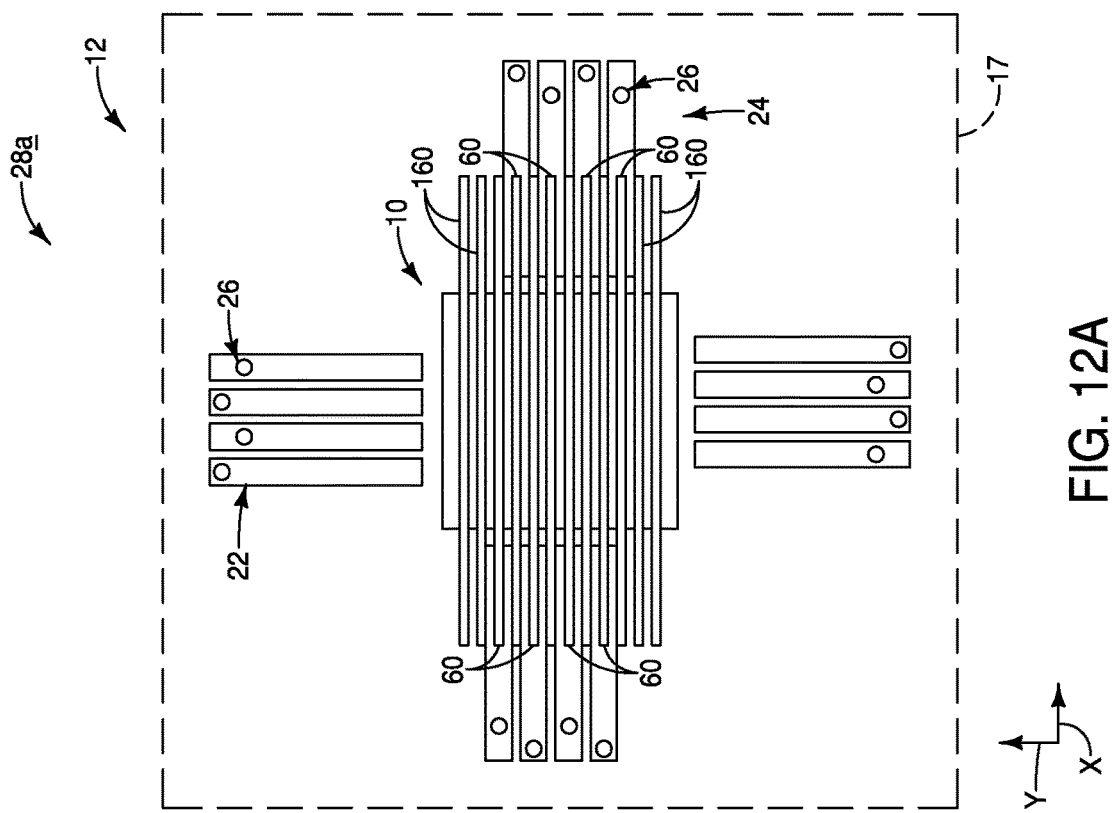

Referring to FIGS. 12A and 12B, the first and second wafers are bonded together to form the assembly 28a (FIG. 12A) or the assembly 28b (FIG. 12B).

The assembly 28a has the first wafer 10 perfectly aligned relative to the second wafer 12. Accordingly, the primary bitlines 60 are aligned with the components 24, and the redundant bitlines 160 are not aligned with the components 24.

In contrast to the assembly 28a, the assembly 28b has the first wafer 10 misaligned relative to the second wafer 12. Accordingly, two of the redundant bitlines 160 are now aligned with components 24 and replace two of the primary bitlines 60.

The specific bitlines 60 replaced in the assembly 28b may be determined utilizing the Equations I and II described previously in this disclosure, as can the specific redundant bitlines 140 that will replace them.

Referring to FIGS. 13A and 13B, the wordlines (wordline components) 40 are formed within the assemblies 28a and 28b. The wordlines may be aligned relative to assembly 28b with methodology of the type described above with reference to FIG. 3B.

Figure 14A:
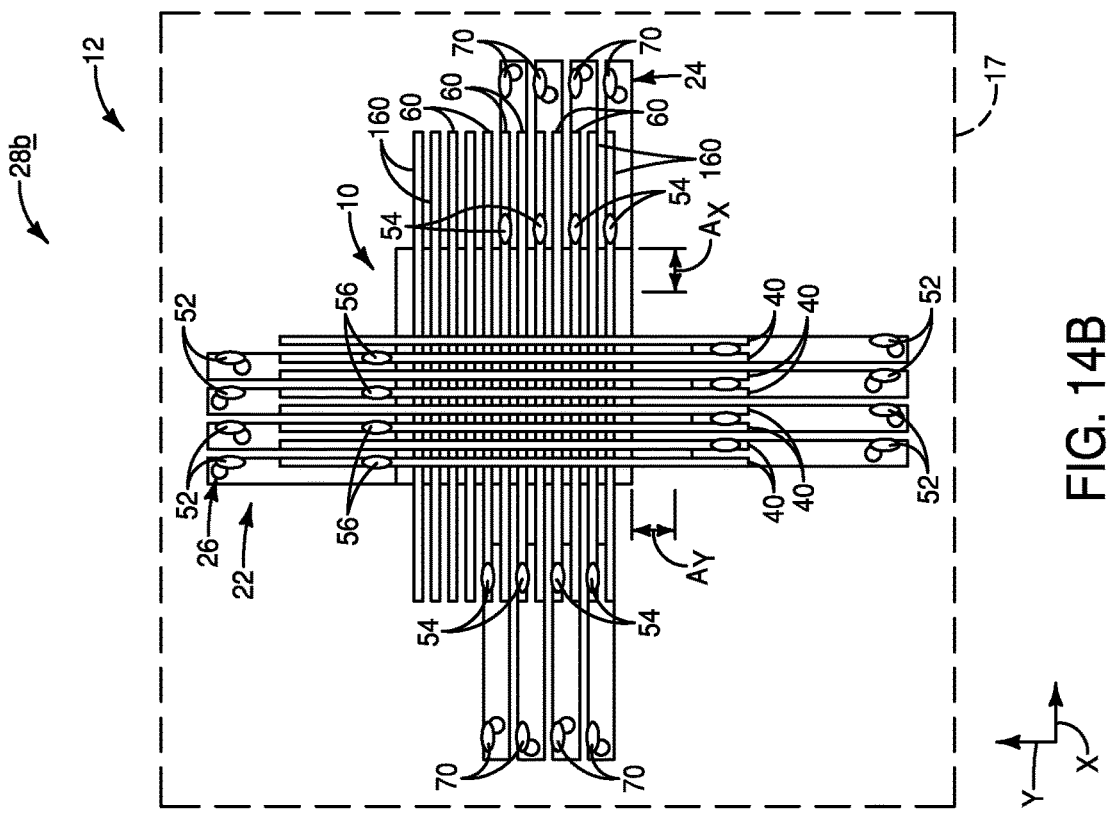
FIGS. 14A and 14B are top views of the assemblies of FIGS. 12A and 12B, respectively, at a process stage subsequent to that of FIGS. 13A and 13B.
Figure 14B:
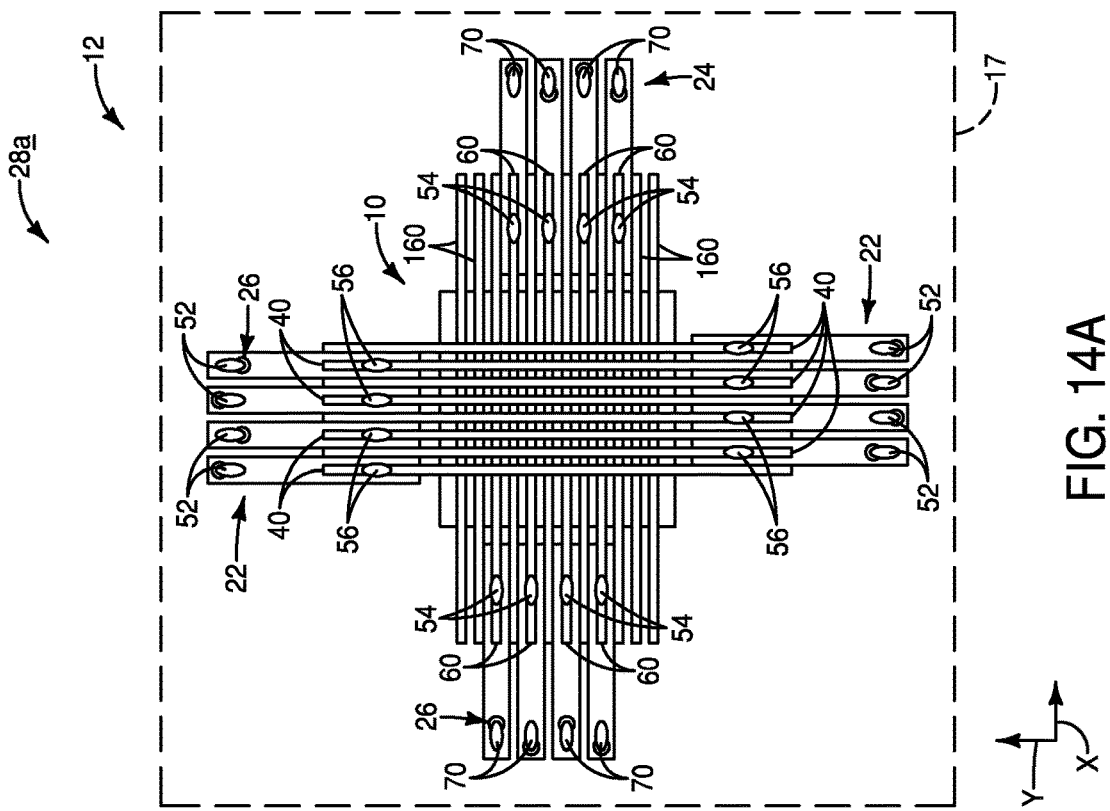

Referring to FIGS. 14A and 14B, contacts 52, 54, 56 and 70 are formed. The locations of the contacts 52, 54, 56 and 70 of assembly 28b may be determined utilizing the Equations I and II described previously in this disclosure.

Figure 15A:
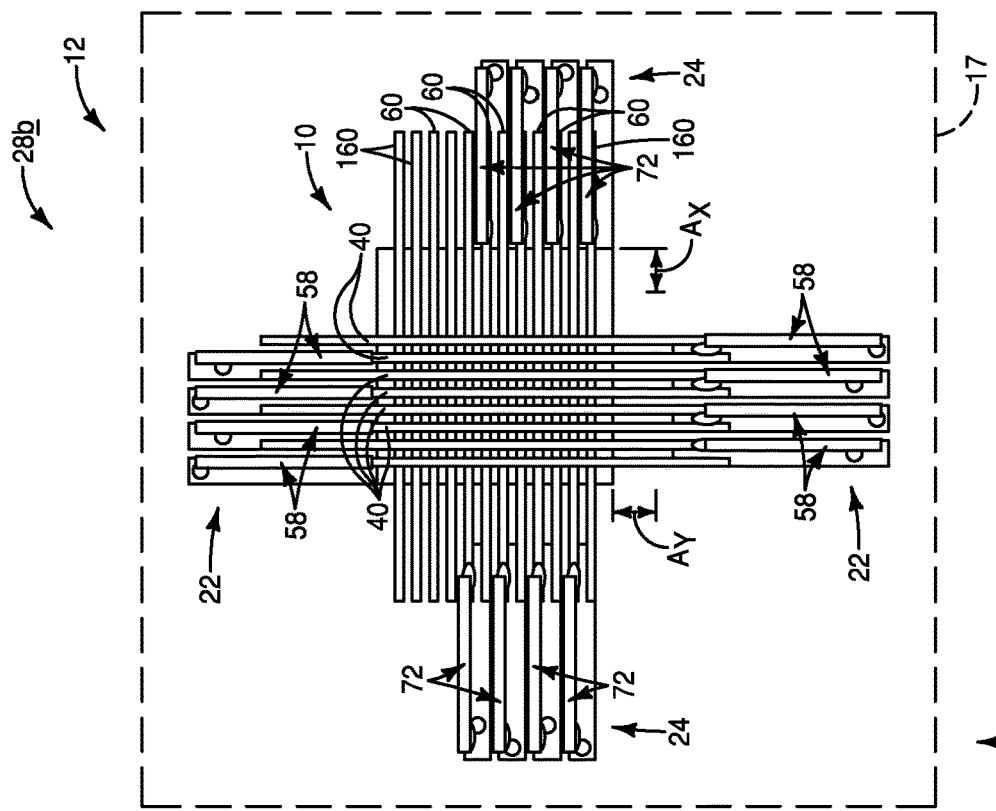
FIGS. 15A and 15B are top views of the assemblies of FIGS. 12A and 12B, respectively, at a process stage subsequent to that of FIGS. 14A and 14B.
Figure 15B:
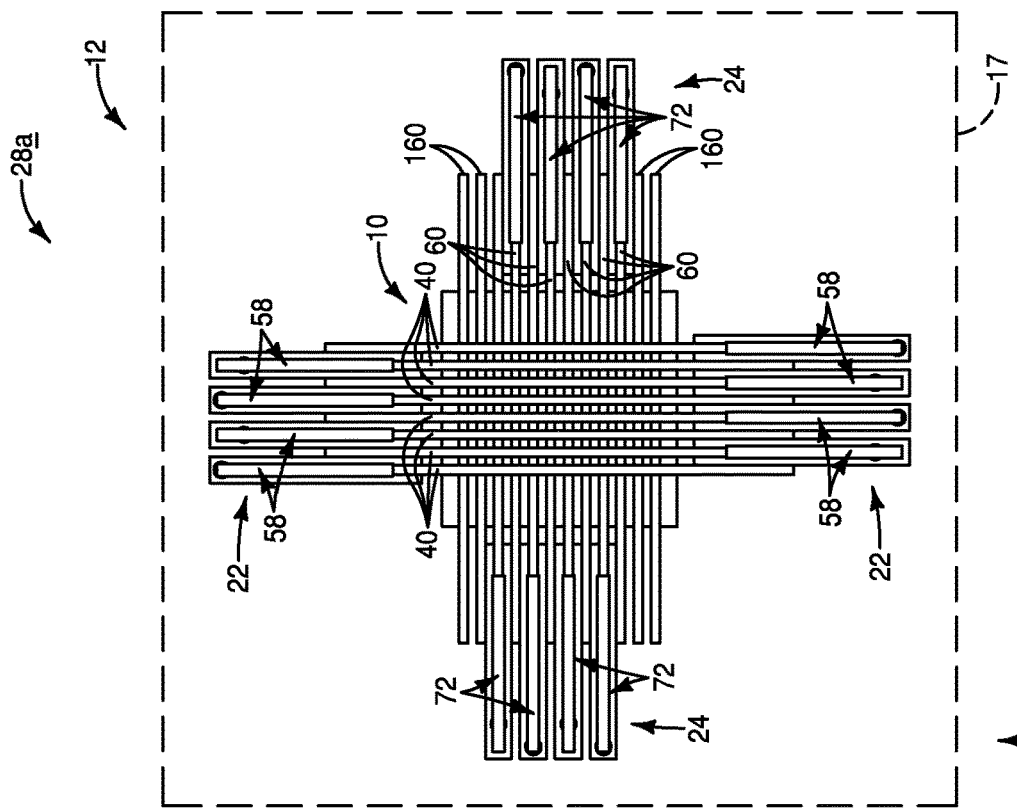

Referring to FIGS. 15A and 15B, interconnects 58 and 72 are formed.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method in which a first semiconductor wafer and a second semiconductor wafer are bonded with each other. The first semiconductor wafer includes a memory cell array, and the second semiconductor wafer includes a circuit to access the memory cell array. After the bonding, contacts are formed to be associated with the first semiconductor wafer. The contacts are for electrical connections between the first and second semiconductor wafers. The contacts are linked with reference positions, with each of the contacts being linked with an associated one of the reference positions. Each of the contacts is shifted from its associated one of the reference positions to absorb a bonding alignment error between the first and second semiconductor wafers.

Some embodiments include a method in which a first semiconductor wafer is bonded to a second semiconductor wafer to form an assembly. First circuitry is formed to be associated with the first semiconductor wafer. The first circuitry includes first components along a pitch P. Second circuitry is formed to be associated with the second semiconductor wafer. The second circuitry includes second components along the pitch P. Redundant first components are formed along the first semiconductor wafer. The second components of the second circuitry are electrically connected with the first components of the first circuitry, and such includes coupling one or more of the second components to one or more of the redundant first components.

Some embodiments include a method in which a first semiconductor wafer is bonded to a second semiconductor wafer to form an assembly. First circuitry is formed to be associated with the first semiconductor wafer. The first circuitry includes a memory array having wordline components extending along a y-axis direction and arranged along a first pitch $P_1$, and having bitline components extending along an x-axis direction and arranged along a second pitch $P_2$. Second circuitry is formed to be associated with the second semiconductor wafer. The second circuitry include wordline coupling components along the first pitch, and includes bitline coupling components along the second pitch. Redundant bitline components are formed along the first semiconductor wafer and/or redundant wordline components are formed along the first semiconductor wafer. The wordline coupling components are electrically connected with the wordline components, and the bitline coupling components are electrically connected with the bitline components. The electrically connections of the wordline coupling components and the bitline coupling components includes coupling one or more of the wordline coupling components with one or more of the redundant wordline components and/or coupling one or more of the bitline coupling components with one or more of redundant bitline components.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method comprising:
bonding a first semiconductor wafer and a second semiconductor wafer with each other, the first semiconductor wafer comprising a memory cell array and the second semiconductor wafer comprising a circuit to access the memory cell array; and forming, after the bonding, a plurality of contacts on the first semiconductor wafer; the plurality of contacts being for electrical connections between the first and second semiconductor wafers; the plurality of contacts being linked to a plurality of reference positions, respectively; wherein each of the contacts of the plurality of contacts is shifted from an associated one of the plurality of the reference positions to absorb a bonding alignment error between the first and second semiconductor wafers.

2. The method of claim 1 further comprising forming both of wordlines and bitlines for the memory cell array of the first semiconductor wafer before the bonding.

3. The method of claim 2 wherein the contacts of said plurality of contacts are along the wordlines.

4. The method of claim 2 wherein the contacts of said plurality of contacts are along the bitlines.

5. The method of claim 2 wherein the reference positions are first reference positions, the bonding alignment error is a first bonding alignment error, and the electrical connections are first electrical connections; wherein the plurality of contacts is a first plurality of first contacts shifted from their associated first reference positions by the first bonding alignment error; and further comprising:

forming, after the bonding, a second plurality of second contacts on the first semiconductor wafer; the second plurality of second contacts being for second electrical connections between the first and second semiconductor wafers; the plurality of second contacts being linked to a plurality of second reference positions, respectively; wherein each of the second contacts of the second plurality of second contacts is shifted from its associated second reference position to absorb a second bonding alignment error between the first and second semiconductor wafers;

wherein the first contacts of the first plurality of the first contacts are along one of the wordlines and the bitlines; and wherein the second contacts of the second plurality of the second contacts are along the other of the wordlines and the bitlines.

6. The method of claim 1 further comprising forming both of wordlines and bitlines for the memory cell array of the first semiconductor wafer after the bonding.

7. The method of claim 6 wherein the contacts of said plurality of contacts are along the wordlines.

8. The method of claim 7 wherein the contacts of said plurality of contacts are formed after forming the wordlines.

9. The method of claim 6 wherein the contacts of said plurality of contacts are along the bitlines.

10. The method of claim 9 wherein the contacts of said plurality of contacts are formed before forming the bitlines.

11. The method of claim 6 wherein the reference positions are first reference positions, the bonding alignment error is a first bonding alignment error, and the electrical connections are first electrical connections; wherein the plurality of contacts is a first plurality of first contacts shifted from their associated first reference positions by the first bonding alignment error; and further comprising:

forming a second plurality of second contacts on the first semiconductor wafer; the second plurality of second contacts being for second electrical connections between the first and second semiconductor wafers; the plurality of second contacts being linked to a plurality of second reference positions, respectively; wherein each of the second contacts of the second plurality of second contacts is shifted from its associated second reference position to absorb a second bonding alignment error between the first and second semiconductor wafers;

wherein the first contacts of the first plurality of the first contacts are along one of the wordlines and the bitlines; and wherein the second contacts of the second plurality of the second contacts are along the other of the wordlines and the bitlines.

12. The method of claim 1 further comprising:
forming one of wordlines and bitlines for the memory cell array of the first semiconductor wafer before the bonding; and
forming the other of wordlines and the bitlines for the memory cell array of the first semiconductor wafer after the bonding.

13. The method of claim 12 wherein the contacts of said plurality of contacts are along said one of the wordlines the bitlines.

14. The method of claim 12 wherein the contacts of said plurality of contacts are along said other of wordlines and the bitlines.

15. The method of claim 12 wherein the reference positions are first reference positions, the bonding alignment error is a first bonding alignment error, and the electrical connections are first electrical connections; wherein the plurality of contacts is a first plurality of first contacts shifted from their associated first reference positions by the first bonding alignment error; and further comprising:
forming a second plurality of second contacts on the first semiconductor wafer; the second plurality of second contacts being for second electrical connections between the first and second semiconductor wafers; the plurality of second contacts being linked to a plurality of second reference positions, respectively; wherein each of the second contacts of the second plurality of second contacts is shifted from its associated second reference position to absorb a second bonding alignment error between the first and second semiconductor wafers;

wherein the first contacts of the first plurality of the first contacts are along said one of the wordlines and the bitlines; and wherein the second contacts of the second plurality of the second contacts are along said other of the wordlines and the bitlines.

16. The method of claim 1 wherein the reference positions are contact reference positions, wherein the circuit comprised by the second semiconductor wafer comprises structures which are electrically coupled with the contacts of said plurality of contacts; wherein the shifting of each of the contacts from the associated contact reference position shifts each of the contacts by a dimension $\Delta$ relative to its associated contact reference position; and further comprising:
forming electrical interconnects to extend from the structures to the contacts; wherein each of the electrical interconnects is shifted by the dimension $\Delta$ relative to an associated electrical interconnect reference position to absorb the bonding alignment error between the first and second semiconductor wafers.

17. The method of claim 16 wherein each of the electrical interconnects are electrically connected to the structures at contact locations; and wherein each of the contact locations is shifted by the dimension $\Delta$ relative to an associated contact location reference position to absorb the bonding alignment error between the first and second semiconductor wafers.

18. A method of forming an integrated structure, comprising:
bonding a first semiconductor wafer to a second semiconductor wafer to form an assembly;
forming first circuitry associated with the first semiconductor wafer;
the first circuitry comprising first components along a pitch P, the first components being one of wordlines or bitlines;
forming second circuitry associated with the second semiconductor wafer, the second circuitry comprising second components along the pitch P;
forming redundant first components along the first semiconductor wafer; and
electrically connecting the second components of the second circuitry with the first components of the first circuitry; the electrically connecting including coupling one or more of the second components to one or more of the redundant first components.

19. The method of claim 18 wherein the second components are comprised by a first set of the second components and a second set of the second components; wherein the first set of the second components is adjacent to a first side of the first semiconductor wafer; wherein the second set of the second components is adjacent to a second side of the first semiconductor wafer, with the second side of the first semiconductor wafer being in opposing relation to the first side of the first semiconductor wafer; wherein the second components comprised by the first set of the second components are along a pitch of 2P; wherein the second components comprised by the second set of the second components are along the pitch of 2P; wherein the first components are comprised by a third set of first components electrically connected to the second components comprised by the first set of the second components, and are comprised by a fourth set of the first components electrically connected to the second components comprised by the second set of the second components; and wherein the first components comprised by the third set of the first components alternate with the first components comprised by the fourth set of the first components.

20. The method of claim 18 wherein:
the first semiconductor wafer of the assembly is shifted from alignment with the second semiconductor wafer of the assembly by a distance A;
a representative one of the first components has an intended coordinate $C_1$ in the assembly;
the electrically connecting of the second components of the second circuitry with the first components of the first circuitry includes compensating for the shift in the alignment by an amount in accordance with the equation, $$C_2=C_1+A+P/2-((A+(P/2))\bmod P);$$

$C_2$ is a new coordinate for the representative one of the first components;
(A+(P/2)) mod P is a remainder obtained by dividing (A+(P/2)) by P;
a dimension $\Delta$ is defined to correspond to $C_2-C_1$, and to have an absolute value of greater than 0.5P; and
said one or more of the redundant first components electrically connected with the second components include one of the redundant first components which is shifted relative to $C_1$ by a distance of $\Delta$.

21. The method of claim 20 further comprising:
forming first contacts over the first components and electrically connected with the first components;
forming second contacts over the second components and electrically connected with the second components; and
forming interconnects electrically connected with the first and second contacts; each of the interconnects extending from one of the first contacts to one of the second contacts.

22. The method of claim 18 wherein the first components are formed prior to the bonding of the first semiconductor wafer to the second semiconductor wafer.

23. The method of claim 18 wherein the first components are wordlines.

24. The method of claim 18 wherein the first components are bitlines.

25. A method of forming an integrated structure, comprising:
bonding a first semiconductor wafer to a second semiconductor wafer to form an assembly;
forming first circuitry associated with the first semiconductor wafer; the first circuitry comprising a memory array having wordlines extending along a y-axis direction and arranged along a first pitch $P_1$, and having bitlines extending along an x-axis direction and arranged along a second pitch $P_2$;
forming second circuitry associated with the second semiconductor wafer; the second circuitry comprising wordline coupling components along the first pitch, and comprising bitline coupling components along the second pitch;
forming redundant bitlines along the first semiconductor wafer and/or forming redundant wordlines along the first semiconductor wafer;
electrically connecting the wordline coupling components with the wordlines, and the bitline coupling components with the bitlines; and
the electrically connecting including coupling one or more of the wordline coupling components with one or more of the redundant wordlines and/or coupling one or more of the bitline coupling components with one or more of redundant bitlines.

26. The method of claim 25 comprising the forming of the redundant wordlines.

27. The method of claim 25 comprising the forming of the redundant bitlines.

28. The method of claim 25 comprising the forming of the redundant bitline components and the forming of the redundant wordlines.

29. The method of claim 28 comprising the coupling of one or more of the wordline coupling components with one or more of the redundant wordlines.

30. The method of claim 28 comprising the coupling of one or more of the bitline coupling components with one or more of the redundant bitlines.

31. The method of claim 28 comprising:
the coupling of one or more of the wordline coupling components with one or more of the redundant wordlines; and
the coupling of one or more of the bitline coupling components with one or more of the redundant bitlines.

32. The method of claim 31 wherein:
the first semiconductor wafer of the assembly is shifted from alignment with the second semiconductor wafer of the assembly by a distance $A_x$ along the x-axis direction, and by a distance $A_y$ along the y-axis direction; a representative one of the wordline components has an intended x-axis coordinate position $C_{1x}$ in the assembly, and a representative one of the bitline components has an intended y-axis coordinate position $C_{1y}$ in the assembly;
the electrically connecting of the wordline coupling components with the wordlines includes compensating for the shift from alignment along the x-axis by an amount in accordance with the equation, $$C_{2x} = C_{1x} + A_x + P_1/2 - ((A_x + (P_1/2)) \bmod P_1);$$

$C_{2x}$ is a new x-axis coordinate for the representative one of the wordline components;
$((A_x + (P_1/2)) \bmod P_1)$ is a remainder obtained by dividing $(A_x + (P_1/2))$ by $P_1$;
a dimension $\Delta_x$ is defined to correspond to $C_{2x} - C_{1x}$, and to have an absolute value greater than $0.5P_1$;
said one or more of the redundant wordlines electrically connected with the wordline coupling components include one of the redundant wordlines which is shifted relative to $C_{1x}$ by a distance of $\Delta_x$; and
the electrically connecting of the bitline coupling components with the bitlines including compensating for the shift from alignment along the y-axis by an amount in accordance with the equation, $$C_{2y} = C_{1y} + \Delta_y + P_2/2 - ((\Delta_y + (P_2/2)) \bmod P_2);$$

$C_{2y}$ is a new y-axis coordinate for the representative one of the bitline components;
$((A_y + (P_2/2)) \bmod P_2)$ is a remainder obtained by dividing $(A_y + (P_2/2))$ by $P_2$;
a dimension $\Delta_y$ is defined to correspond to $C_{2y} - C_{1y}$, and to have an absolute value greater than $0.5P_2$; and
said one or more of the redundant bitlines electrically connected with the bitline coupling components include one of the redundant bitlines which is shifted relative to $C_{1y}$ by a distance of $\Delta_y$.

33. The method of claim 32 further comprising:
forming first contacts over the wordlines and electrically connected with the wordlines;
forming second contacts over the wordline coupling components and electrically connected with the wordline coupling components;
forming third contacts over the bitlines and electrically connected with the bitlines;
forming fourth contacts over the bitline coupling components and electrically connected with the bitline coupling components;
forming first interconnects electrically connected with the first and second contacts; each of the first interconnects extending from one of the first contacts to one of the second contacts; and
forming second interconnects electrically connected with the third and fourth contacts; each of the second interconnects extending from one of the third contacts to one of the fourth contacts.

34. The method of claim 25 wherein the wordlines are formed prior to the bonding of the first semiconductor wafer to the second semiconductor wafer.

35. The method of claim 25 wherein the bitlines are formed prior to the bonding of the first semiconductor wafer to the second semiconductor wafer.

36. The method of claim 25 wherein the wordlines are formed after the bonding of the first semiconductor wafer to the second semiconductor wafer.

37. The method of claim 25 wherein the bitlines are formed after the bonding of the first semiconductor wafer to the second semiconductor wafer.

38. The method of claim 25 wherein one of the bitlines and the wordlines is formed before the bonding of the first semiconductor wafer to the second semiconductor wafer; and wherein the other of the wordlines and the bitlines is formed after the bonding of the first semiconductor wafer to the second semiconductor wafer.

* * * * *